(12) United States Patent
Clevenger et al.

(10) Patent No.: US 7,531,407 B2
(45) Date of Patent: May 12, 2009

(54) SEMICONDUCTOR INTEGRATED CIRCUIT DEVICES HAVING HIGH-Q WAFER BACKSIDE INDUCTORS AND METHODS OF FABRICATING SAME

(75) Inventors: Lawrence Clevenger, LaGrangeville, NY (US); Timothy Joseph Dalton, Ridgefield, CT (US); Louis Hsu, Fishkill, NY (US); Carl Radens, LaGrangeville, NY (US); Vidhya Ramachandran, Ossining, NY (US); Keith Kwong Hon Wong, Wappingers Falls, NY (US); Chih-Chao Yang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 133 days.

(21) Appl. No.: 11/488,242

(22) Filed: Jul. 18, 2006

(65) Prior Publication Data

US 2008/0020488 A1   Jan. 24, 2008

(51) Int. Cl.
   *H01L 21/8234*   (2006.01)
(52) U.S. Cl. ............... 438/238; 438/381; 257/E21.022
(58) Field of Classification Search ................ 438/238, 438/381; 257/E21.022
   See application file for complete search history.

(56) References Cited

U.S. PATENT DOCUMENTS

| | | | |
|---|---|---|---|
| 6,054,329 A | 4/2000 | Burghartz et al. | 438/3 |
| 6,121,659 A * | 9/2000 | Christensen et al. | 257/347 |
| 6,452,249 B1 | 9/2002 | Maeda et al. | 257/531 |
| 6,593,200 B2 | 7/2003 | Kalnitsky et al. | 438/363 |
| 6,593,838 B2 | 7/2003 | Yue | 336/84 |
| 6,720,230 B2 | 4/2004 | Acosta et al. | 438/381 |
| 2005/0101116 A1* | 5/2005 | Tseng | 438/622 |
| 2005/0181537 A1* | 8/2005 | Derbenwick et al. | 438/107 |
| 2006/0012005 A1* | 1/2006 | Leib et al. | 257/528 |
| 2007/0007595 A1* | 1/2007 | Hirano et al. | 257/347 |

* cited by examiner

*Primary Examiner*—H. Jey Tsai
(74) *Attorney, Agent, or Firm*—Robert M. Trepp

(57) ABSTRACT

Methods are provided for fabricating semiconductor IC (integrated circuit) chips having high-Q on-chip inductors formed on the chip backside and connected to integrated circuits on the chip frontside using through-wafer interconnects. For example, a semiconductor device with a backside integrated inductor includes a semiconductor substrate having a frontside, a backside and a buried insulating layer interposed between the front and backsides of the substrate. An integrated circuit is formed on the frontside of the semiconductor substrate and an integrated inductor is formed on the backside of the semiconductor substrate. An interconnection structure is formed through the buried insulating layer to connect the integrated inductor to the integrated circuit. The semiconductor substrate may be an SOI (silicon on insulator) structure.

11 Claims, 22 Drawing Sheets

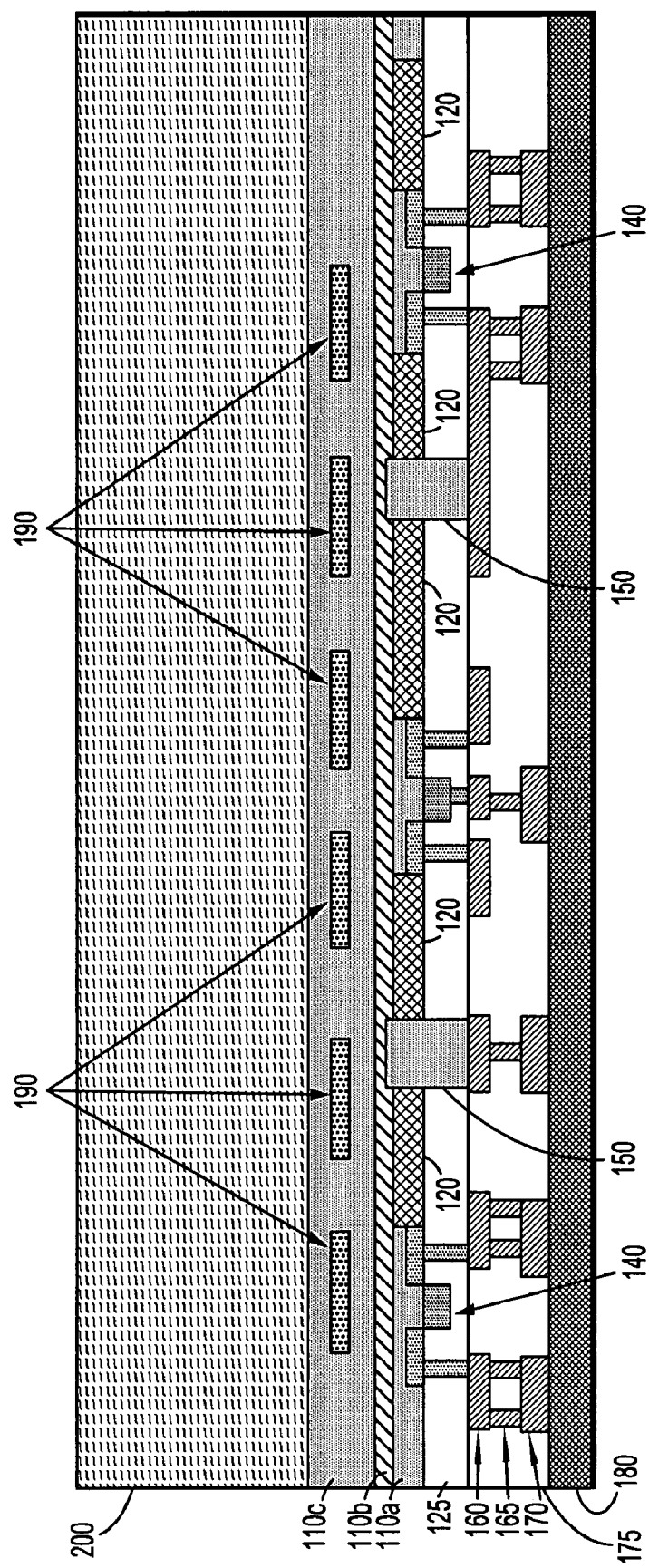

SEMICONDUCTOR INTEGRATED CIRCUIT DEVICES HAVING HIGH-Q WAFER BACKSIDE INDUCTORS AND METHODS OF FABRICATING SAME

TECHNICAL FIELD OF THE INVENTION

The present invention relates generally to methods for fabricating semiconductor IC (integrated circuit) chips having high-Q on-chip inductors and, more specifically, semiconductor IC chips having high-Q inductors that are formed on the chip backside and connected to integrated circuits on the chip frontside using through-wafer interconnects.

BACKGROUND

Advances in semiconductor IC (integrated circuit) chip fabrication and packaging technologies have enabled development of highly integrated semiconductor IC chips and compact chip package structures (or electronic modules). Passive components such as capacitors, resistors and inductors are fundamental circuit components that are commonly used in chip fabrication/packaging designs. In particular, inductors are typically used in analog and mixed signal chip designs for constructing various circuits such as voltage controlled oscillators (VCOs), low-noise amplifiers (LNAs), mixers, filters and other integrated circuits. Passive components such as inductors can be fabricated as off-chip or on-chip components.

By way of example, inductors components can be fabricated as off-chip components as part of a chip package or disposed at some other location (e.g., printed circuit board). In such off-chip designs, the inductors can be connected to on-chip integrated circuits through C4 contacts or other chip-package contacts such as wire bonds, etc, which can significantly increase the series resistance and degrade circuit performance. Moreover, off-chip designs may not be suitable for high-density integration designs.

Another conventional method for implementing inductors as circuit elements includes constructing inductors as part of the frontside integrated circuit. For instance, on-chip inductors can be fabricated as part of the BEOL (back-end-of-line) wiring structure, which provides interconnects between frontside integrated circuit components. The inductor coils can be patterned in the wiring metallization levels, or patterned in metallization levels that are specifically designed for inductors.

There are various disadvantages to frontside inductor designs. For example, when an inductor is formed using thin metal films of the BEOL metallization levels, the quality (Q) factor of the inductor can decrease due to higher parasitic resistance if the inductor wires are not made wide enough to minimize the resistance. Moreover, to minimize self-capacitance, the wide inductor wires must be spaced sufficient fart apart. Consequently, the increased width and spacing of the conductor wires results in an inductor structure with a relatively large footprint.

Further, the Q factor of a frontside inductor can decrease due to coupling/crosstalk with substrate devices. In particular, eddy currents may be induced between an on-chip conductor and a conductive region in the vicinity of the on-chip inductor which reduces the effective inductance and limits the Q factor of the inductor. In addition, the inductor electric field can cause current to flow in the surrounding substrate or dielectric layers leading to further resistive losses and reduction of inductor Q factor.

Various techniques have been employed to shield (e.g., ground shields/planes) or otherwise isolate (e.g., trench isolation regions) frontside inductors to reduce such coupling/crosstalk and minimize eddy current, and thus improve the Q factor for frontside inductors. The improvement of the Q factor is achieved, however, at the expense of chip real estate as the inductor wires and associated shielding and isolation components/structures can occupy a relatively large 3-D space, which limits integration density of devices on a chip.

SUMMARY OF THE INVENTION

Exemplary embodiments of the invention generally include methods for fabricating semiconductor IC (integrated circuit) chips having high-Q on-chip inductors formed on the chip backside and connected to integrated circuits on the chip frontside using through-wafer interconnects In one exemplary embodiment of the invention, a semiconductor device with a backside integrated inductor includes a semiconductor substrate having a frontside, a backside and a buried insulating layer interposed between the front and backsides of the substrate. An integrated circuit is formed on the frontside of the semiconductor substrate and an integrated inductor is formed on the backside of the semiconductor substrate. An interconnection structure is formed through the buried insulating layer to connect the integrated inductor to the integrated circuit. The semiconductor substrate may be an SOI (silicon on insulator) structure.

In one exemplary embodiment, the interconnection structure is formed by a through-wafer frontside contact plug having a first end in the semiconductor substrate and a second end contacting a frontside metal level, and a through-wafer backside contact plug having a first end in the semiconductor substrate and a second end contacting an inductor coil structure. The first ends of the through-wafer frontside and backside contact plugs are in electrical contact and may be disposed in the buried insulating layer of the semiconductor substrate.

In one exemplary embodiment of the invention, the integrated inductor comprises one or more layers of metal embedded in an insulating layer on the backside of the semiconductor substrate. The integrated inductor structure can be formed from a first level of metallization formed in via holes etched in the backside insulating layer to form backside contact plugs, and a second level of metallization formed in a trench etched in the backside insulating layer to form an inductor coil. The backside contact plugs form part of the interconnection structure for connecting the inductor coil to the frontside integrated circuit.

In another embodiment of the invention, the backside insulating material may be removed to form an air gap between the inductor coil and the backside surface of the semiconductor substrate. Dummy contact plugs can be formed as part of the first level of metallization to server as support columns for the inductor coil structure in the absence of the supporting backside insulating material, where the dummy contact plugs do not serve as electrical interconnections to the frontside integrated circuit, but server as support and anchor structures to prevent delamination or collapse of the inductor coil.

In another exemplary embodiment of the invention, a ground plane may be disposed between the integrated inductor and the integrated circuit. The ground plane may be insulating islands formed by oxygen ion implantation on the backside of the semiconductor substrate. The ground plane may be shallow trench isolation patterns formed on the backside of the semiconductor substrate. The ground plane may be doped regions of silicon formed on the backside of the semiconductor substrate.

These and other exemplary embodiments, aspects, features and advantages of the present invention will be described or become apparent from the following detailed description of exemplary embodiments, which is to be read in connection with the accompanying drawings.

BRIEF DESCRIPTION OF THE DRAWINGS

FIGS. 3A~3L schematically illustrate a method for fabricating a semiconductor IC chip with backside integrated inductors according to an exemplary embodiment of the invention.

DETAILED DESCRIPTION OF EXEMPLARY EMBODIMENTS

Exemplary embodiments of the invention will be discussed in further detail hereafter regarding semiconductor IC chips having high-quality, integrated inductors that are fabricated on the chip backside and connected to integrated circuits on the chip frontside using through-wafer interconnects. For example, exemplary chip fabrication techniques according to the invention as discussed below include methods for constructing high-Q capacitor structures on the backside of a semiconductor SOI (silicon-on-insulator) wafer while preserving the frontside silicon real estate for achieving high density integration chip design. As discussed in detail below, exemplary chip fabrication techniques enable high density integration and precision fabrication of high Q inductors with high self-resonance frequencies and low cross talk to frontside integrated circuits.

Figure 1:
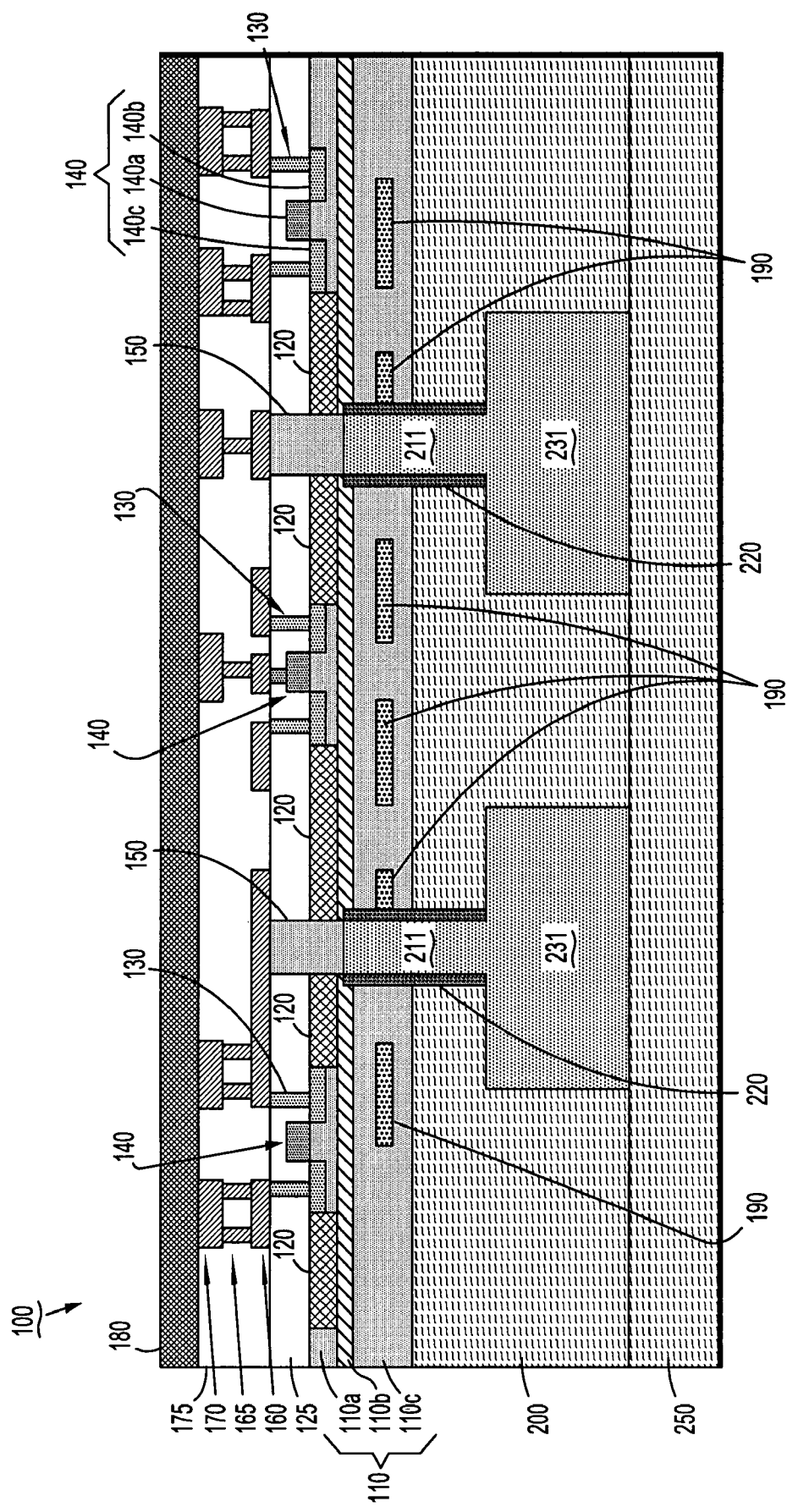
FIG. 1 is schematic cross-sectional view of a semiconductor IC chip having an integrated inductor formed on the backside of the chip and connected to an integrated circuit on the frontside of the chip using through-wafer interconnects, according to an exemplary embodiment of the invention.

FIG. 1 is schematic cross-sectional view of a semiconductor IC device (100) according to an exemplary embodiment of the invention, which generally comprises a semiconductor substrate (110) (or wafer) having a front (active) side and a back (non-active) side. In the exemplary embodiment, the semiconductor substrate (110) comprises a SOI (silicon on insulator) substrate (110) (or wafer) comprising a thin surface layer of silicon (110a) and a buried oxide (BOX) layer (110b) stacked on a bulk silicon layer (110c) (which may also be referred to as a carrier layer or a support layer, for example). The frontside of the substrate (110) comprises an integrated circuit formed by FEOL (front-end-of-line) and BEOL (back-end-of-line) structures, and the backside of the substrate (110) comprises an integrated inductor that is connected to the frontside integrated circuit by an interconnection structure formed through the semiconductor substrate (110).

More specifically, on the font side of the substrate (110), a plurality of STI (shallow trench isolation) regions (120) are formed in the silicon layer (110a) to define active regions for circuit components (140). In the exemplary embodiment, the circuit components (140) are depicted as transistors comprising gate elements (140a) and diffusion regions (140b) and (140c) formed in the silicon layer (110a) providing drain/source elements for the transistors. The circuit components (140) can be formed using standard FEOL fabrication techniques known to those of ordinary skill in the art.

The semiconductor device (100) has a frontside interconnection structure that is formed using standard BEOL (back-end of line) fabrication techniques. A first insulation layer (125) (or ILD (interlayer dielectric layer) is formed to cover the circuit components (140). A plurality of contact plugs (130) are formed in the insulation layer (125) to provide contacts between device terminals (140a), (140b) and/or (140c) and a first level metallization (160). Moreover, a plurality of through-wafer frontside contact plugs (150) are formed in the insulation layer (125) to contact with the first level metallization (160) and extend into the BOX layer (110b). As explained below, the through-wafer frontside contact plugs (150) form part of the interconnect structures that connect the frontside integrated circuit with an inductor formed on the backside of the substrate (110). Moreover, the through-wafer frontside contact plugs (150) may be used as alignment marks for the backside lithographic processes that are performed to fabricate backside inductor structures and associated elements.

A plurality of inter-level contacts plugs (165) are formed to provide interconnections between the first level metallization (160) and a second level metallization (170). The first and second level metallization (160) and (170) and inter-level contact plugs (165) are embedded in one or more layers of ILD (inter level dielectric) material (175). A frontside passivation layer (180) is formed over the frontside metallization structure.

The semiconductor device (100) further comprises an integrated inductor structure and associated elements formed on the backside of the substrate (110). In particular, in the exemplary embodiment of FIG. 1, an inductor ground plane (190) (or ground shield) is formed in the bulk silicon layer (110c). A backside insulating layer (200) is formed on the bulk silicon layer (110c). An integrated inductor structure is formed by several metallization levels formed in the backside insulation layer (200). A first level of backside metallization is formed to provide through-wafer backside contact plugs (211), and a second level of backside metallization is formed to provide an inductor coil (231). A backside passivation layer (250) is formed over the inductor coil (231).

The through-wafer backside contact plugs (211) are formed to connect to the through-wafer frontside contact plugs (150), thereby providing a through-wafer interconnect structure that connects the inductor coil (231) and frontside integrated circuit through the substrate (110). The through-wafer backside contact plugs (211) are lined with a relatively thick liner layer (220) to isolate the through-wafer backside contact plugs (211) from the bulk silicon layer (110c) of the substrate (110) and thereby reduce substrate losses.

It is to be understood that the exemplary embodiment of FIG. 1 depicts a general framework for an integrated backside inductor structure, and in particular, an integrated backside inductor structure with a ground plane (or ground shield) (190) and inductor coil (231) embedded in the layer of insulation (200). The ground shield (190) serves to break up conductive paths that may be induced on the chip substrate (110) and otherwise minimize or eliminate coupling/crosstalk between the inductor (231) coil and the substrate (110) and the frontside integrated circuit on the active surface of the substrate (110). In one exemplary embodiment, the inductor structure may be formed of a planar spiral inductor such as depicted in the exemplary embodiment of FIG. 2, although other inductor structures may be implemented (e.g., square, hexagonal, octagonal, circular inductors, etc.).

Figure 2:
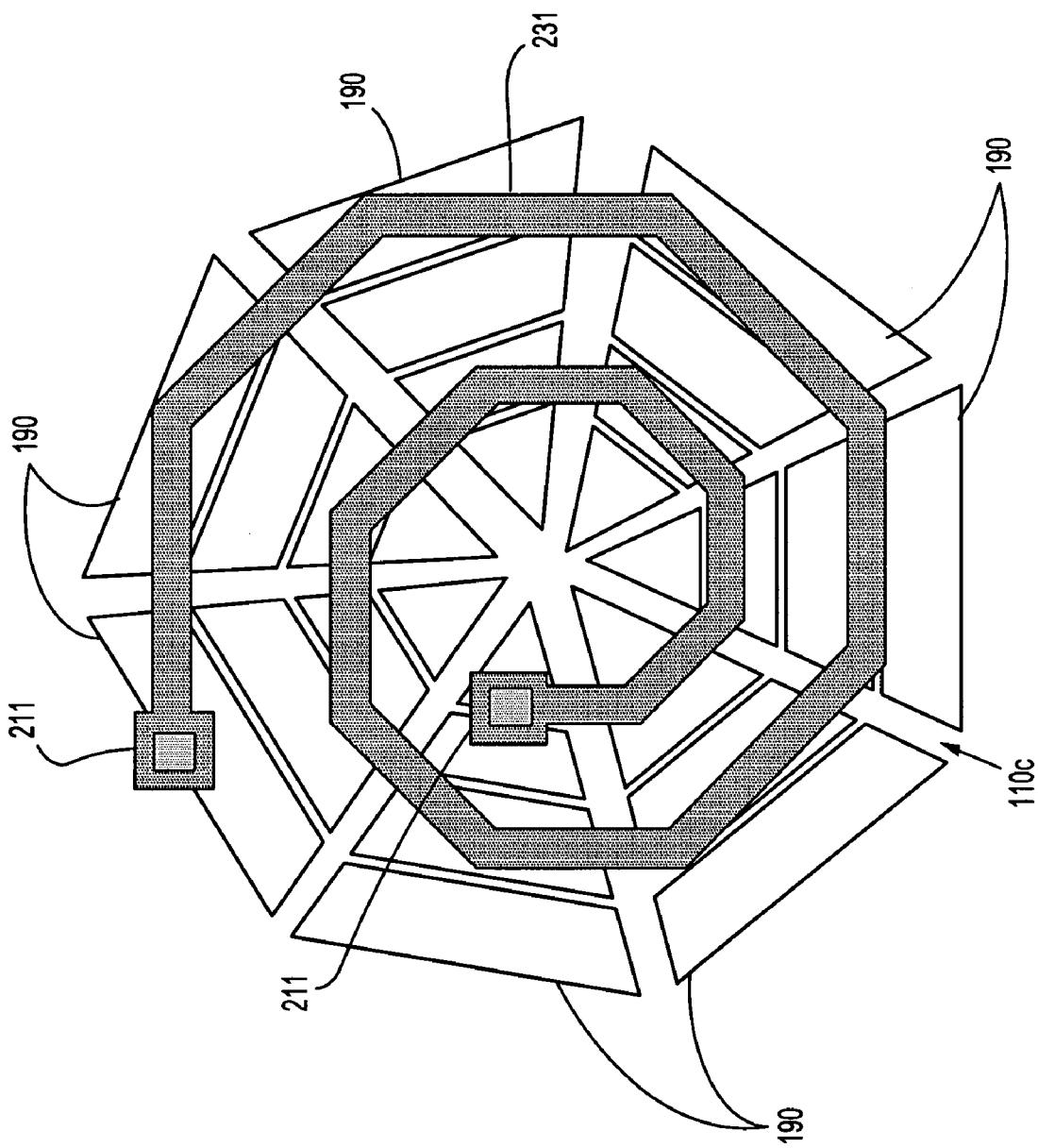
FIG. 2 is a schematic plan view of a backside integrated inductor structure with patterned ground plane according to an exemplary embodiment of the invention.

In particular, FIG. 2 schematically illustrates an exemplary embodiment of the inductor coil (231) in the form of a planar spiral inductor and the ground plane (190) in the form of a segmented radial shielding pattern. In the exemplary embodiment of FIG. 2, the end portions of the spiral inductor coil (231) are connected to, and aligned with, the through-wafer backside contact plugs (211) that extend through the ground plane (190) and contact the through-wafer frontside contact plugs (150) as described above. In general, the backside ground plane layer (190) may be patterned either in the substrate (110) or in the backside insulation layer (200). In various exemplary embodiments of the invention discussed further below, the backside ground plane (190) may be comprised of insulating islands formed by oxygen ion implantation or shallow trench isolation embedded in the bulk silicon layer (110c), or doped regions of silicon providing high-resistive depletion regions.

Figure 3A:
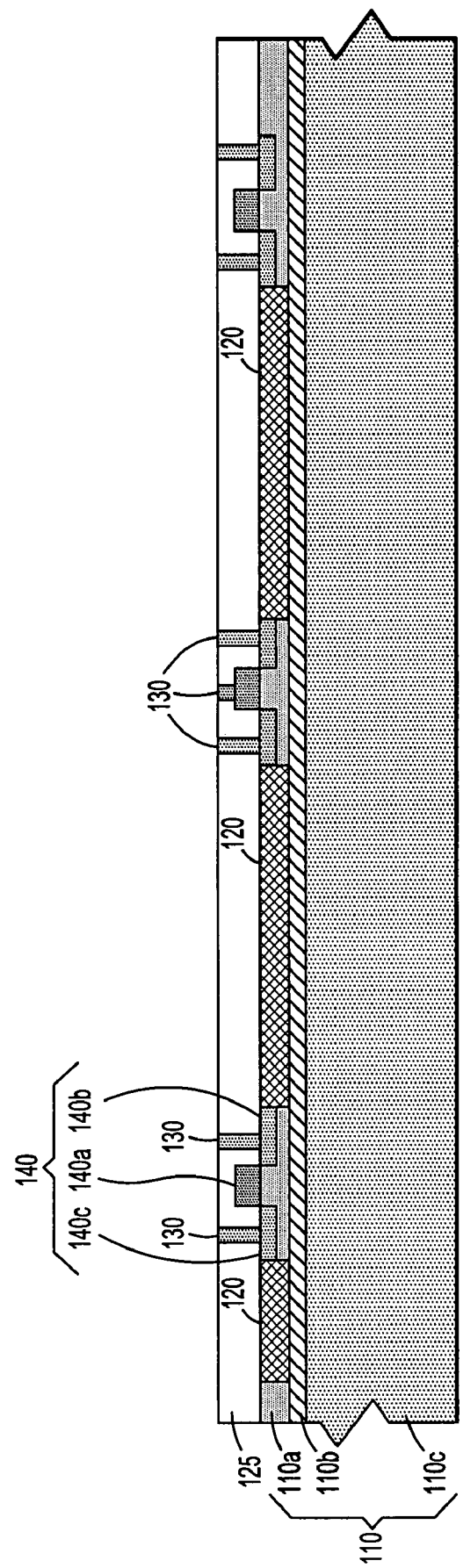
Figure 3B:
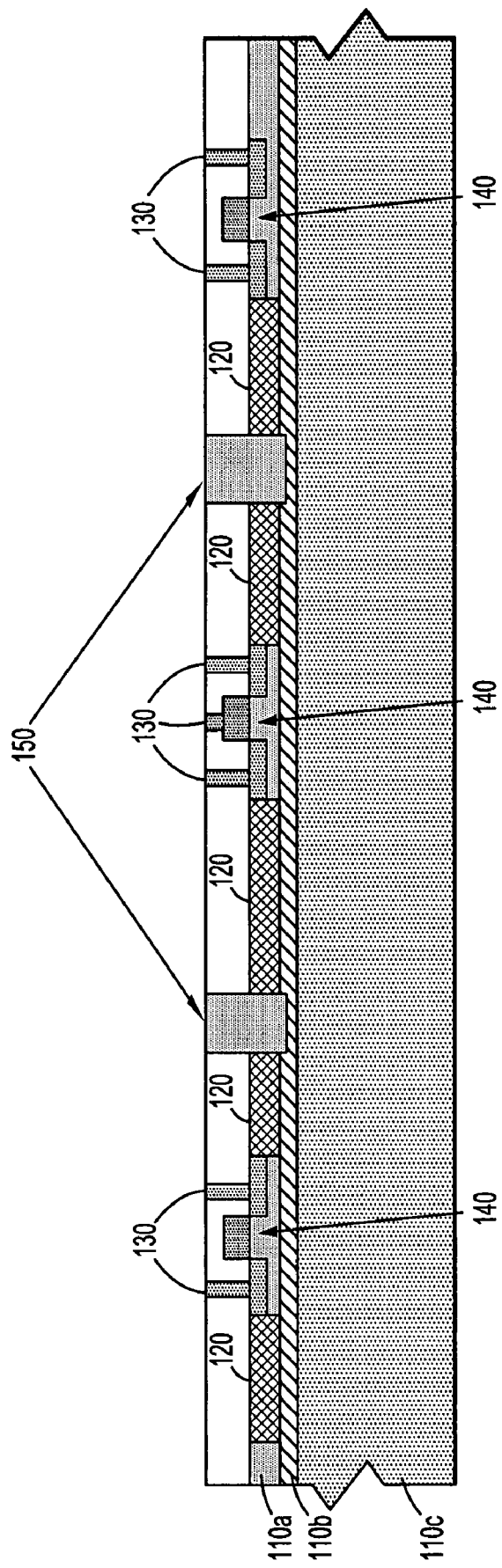
Figure 3C:
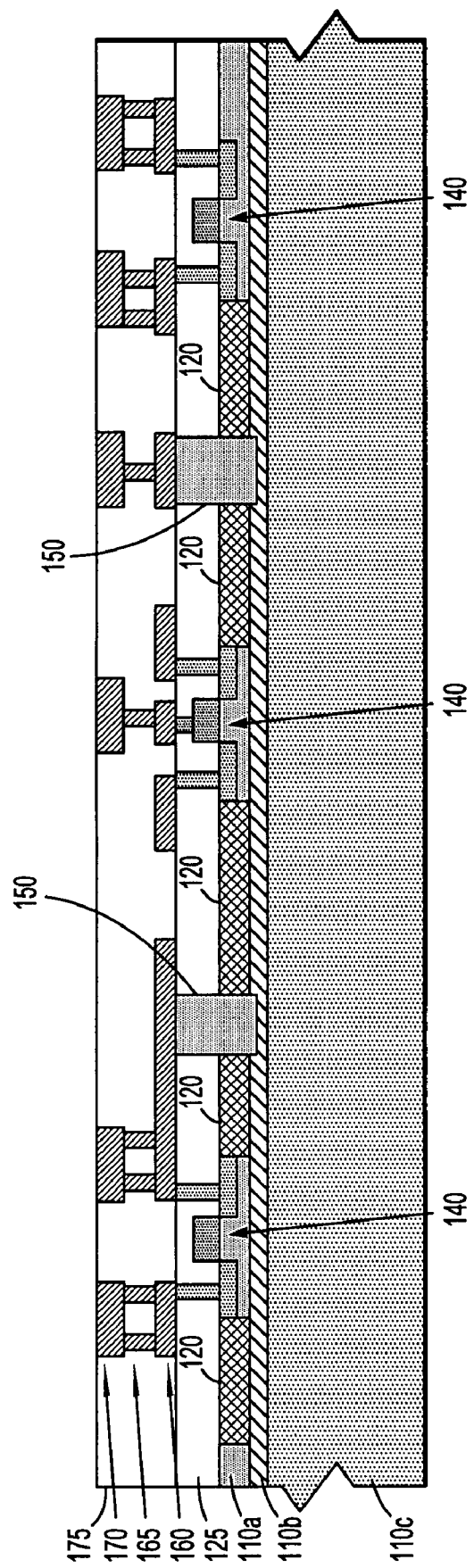
Figure 3D:
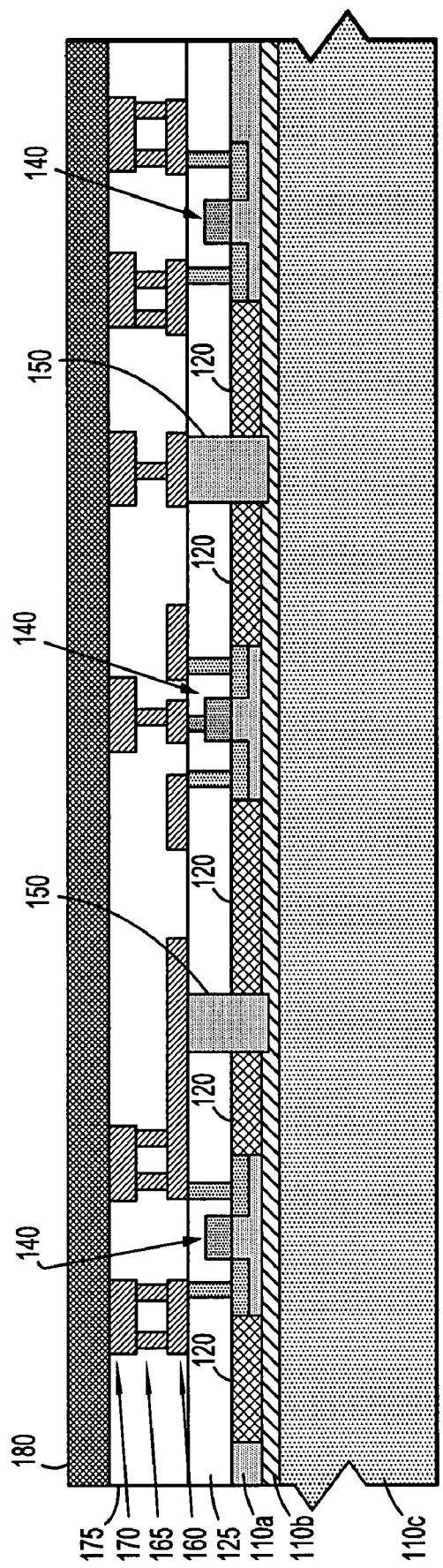
Figure 3E:
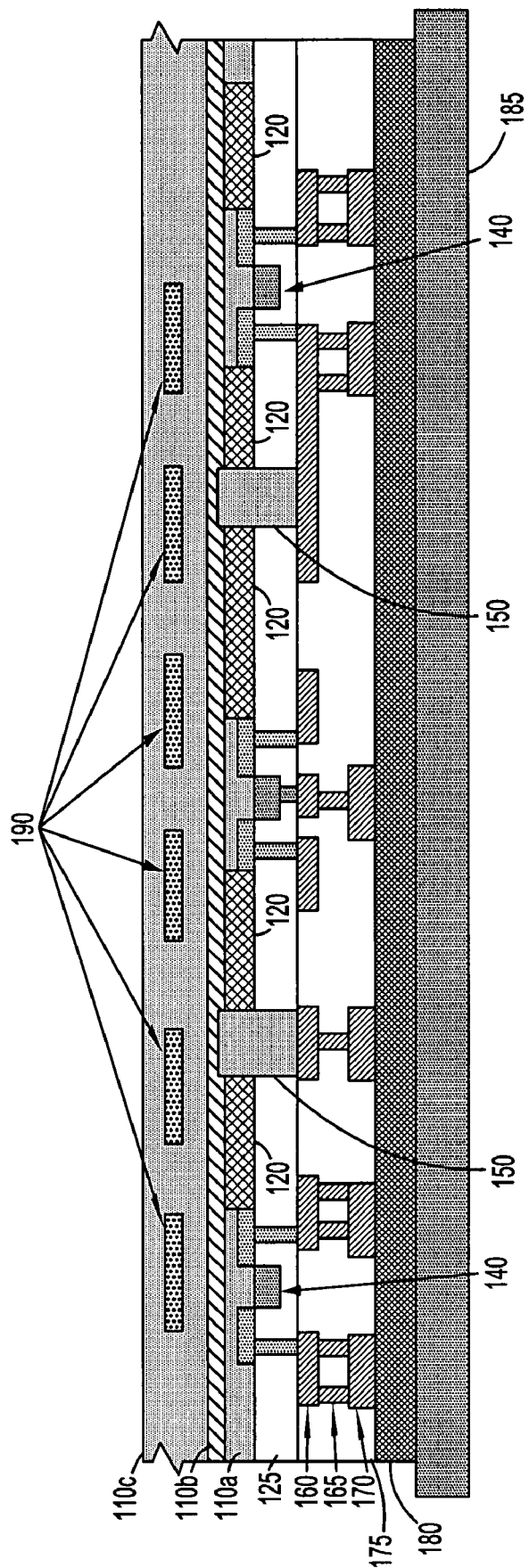

FIGS. 3A~3L schematically illustrate a method for fabricating microelectronic chip with a backside inductor connected to frontside circuits using through-wafer contacts, according to an exemplary embodiment of the invention. For purposes of illustration, methods for fabricating the semiconductor device (100) of FIG. 1 will be discussed with reference to FIGS. 3A~3L. In general, FIGS. 3A~3D illustrate various stages of frontside processing to fabricate active components (e.g., transistors) metallization on a frontside of a semiconductor substrate (110), and FIGS. 3E~3F illustrate various stages of backside processing to fabricate an integrated inductor and ground plane on the backside of the semiconductor substrate and connect the inductor to the frontside circuit.

FIG. 3A illustrates structure that is formed as a result of initial stages of device fabrication starting with the semiconductor substrate (110) comprising the silicon layer (110a), BOX layer (110b) and bulk silicon layer (110c) (which can be prefabricated or formed using known techniques), and forming the STI regions (120), the active devices (140), the insulation layer (125) and the contact plugs (130) on the frontside of the semiconductor substrate (110) using standard techniques.

The silicon layer (110a) and BOX layer (110b) together constitute the silicon on insulator (SOI) structure that can be formed using conventional methods for fabricating SOI structures. For example, the SOI substrate can be fabricated using the known SIMOX (separation by implementation of oxygen" process whereby a high energy oxygen implantation process is performed to implant oxygen atoms into the surface of a bare silicon wafer, followed by wafer anneal at a high temperature to form the SOI layer (i.e., silicon layer (110a) on oxide layer (110b)). The thickness of the buried oxide layer (110b) and silicon layer (110a) can vary depending on the device requirements. For example, the thickness of the silicon layer (110a) ranges from approximately 500 angstroms to about 5000 angstroms, and the thickness of the buried oxide layer (110b) can range from approximately 500 angstroms to about 1 micron. The remaining bulk silicon layer (110c) has an initial thickness in a range of about 5 microns to about 15 microns depending on the wafer size (wafer thickness increases as size of wafer increases).

The STI region (130) and active devices (140) are formed on the frontside of the semiconductor substrate (110) using standard FEOL fabrication techniques such as dopant diffusion and implantation, sputtering of polysilicon gate films, oxidations, and associated patterning steps. For example, the STI regions (120) can be formed by depositing thin pad oxide and SiN films and patterning the films to form a mask for etching STI trenches in the silicon layer (110a) down to the BOX layer (110b). A thermal oxidation process is performed to form liner of oxide material on the sidewalls of the trenches followed by an oxide deposition to fill the trenches (via LPCVD or HDP) and subsequent oxide etch back and polishing (e.g., CMP).

Thereafter, active components (140) including MOS transistors are formed in active areas of the silicon layer (110a) defined by the STI regions (120). The active devices (140) may be formed using standard FEOL fabrication techniques such as dopant diffusion and implantation, sputtering of polysilicon gate films, oxidations, and associated patterning steps. In the exemplary embodiment, the STI regions (120) are formed down to the BOX layer (110b) such that the SOI completely isolates each active device (140) from a neighboring component (140). As noted above, the active devices (140) include MOS transistors having polysilicon gate structures (140a) and source/drain diffusion regions (140b/140c). The active devices (140) are electrically isolated from the bulk wafer (110c) by the BOX layer (110b) and electrically isolated from each other by the STI regions (120). The active devices (140) may be formed using standard FEOL fabrication techniques such as dopant diffusion and implantation, sputtering of polysilicon gate films, oxidations, and associated patterning steps.

As further depicted in FIG. 3A, after the circuit components (140) are formed, a first planar insulation layer (125) is formed to cover the active devices (140) and the contact plugs (130) (referred to as CA contacts) are formed in the dielectric layer (125) to provide contacts between gate/drain/source terminals of the active components (140) and a first metallization level (as described below). The contacts (130) may be formed of standard materials such as copper or tungsten.

Referring to FIG. 3B, through-wafer frontside contact plugs (150) are also formed in the dielectric layer (125) but are formed to extend down into the BOX layer (110b). In one exemplary embodiment, the through-wafer frontside contact plugs (150) may be fabricated using standard BEOL processing techniques. For instance, the contact plugs (150) may be defined by photolithographic ally aligning a resist mask to the prior patterns on the wafers and using the resist mask to drill contact holes through the contact layer dielectric (125) and STI (120), stopping inside the BOX layer (110b). Thereafter, a layer of metallic material, such as copper, is deposited to fill the contact holes, and the layer of metal is polished back to the surface of the dielectric layer (125) to form the contact plugs (150). In one exemplary embodiment, the through wafer frontside contacts (150) may be formed with diameters in a range of about 5 microns to about 50 microns. However, the through-wafer frontside contact plugs can be made as wide as possible without resulting in undesirable loss of performance. Indeed, if the through-wafer frontside contact plugs (150) are made too wide, there may be a large inductor-to-substrate coupling since the contacts (150) pass through the substrate (100), resulting in performance loss. This substrate coupling may be reduced when the contact plugs (150) are formed partially through the substrate but surrounded by STI (120) and BOX (110b) insulation material, which serves to isolate the contact plugs (150) from the silicon material of the substrate (110).

After formation of the contacts (130) and through-wafer frontside contact plugs (150), processing continues to complete the frontside metallization. For instance, referring to FIG. 3C, the first metallization layer (160), inter-level contact plugs (165) and second level metallization layer (170) are formed of metallic material such as copper, aluminum, or alloys thereof, using known techniques (e.g., damascene, dual damascene, subtractive metal etch) with metallic material such as Cu or Al, for example. Although the exemplary embodiments described herein depict two metal layers (160) and (170), this is merely illustrative and it should be understood that the semiconductor device (100) may be formed with more or less metal layers, depending on the application.

After frontside metallization is complete, the wafer is passivated to form a passivation layer (180) over the frontside of the substrate, such as illustrated in FIG. 3D. The passivation layer (180) may be a thick layer of spin-on or deposited material such as an oxide or BPSG (boron phosphorous-doped silicate glass). The passivation layer (180) is formed to provide electrical and mechanical protection to the frontside of the chip for subsequent backside processing, as will be described with reference to FIGS. 3E–3L.

Referring to FIG. 3E, the substrate is flipped over and a wafer carrier (185) is temporarily bonded to the passivation layer (180) such that mechanical and electrical stress may be placed on the passivation layer (180) through the carrier (185) during backside processing. In one exemplary embodiment, the bulk silicon wafer layer (110c) is subjected to polishing/grinding process to thin the wafer down to 50-600 microns. The thinning of the substrate serves to reduce the length of the through-wafer interconnects that electrically connect the backside inductor and integrated circuit, thereby reducing the series resistance and thus enhance performance. By making the passivation layer (180) sufficiently thick, sufficient mechanical support for the chip can be provided by the passivation layer (180) when the substrate is made significantly thin.

As further depicted in FIG. 3E, after wafer thinning, the backside inductor ground plane (190) is formed. The ground plane (190) may be a conductive/semi-conductive region that is formed under the inductor metallization to minimize or eliminate inductive currents and thus reduces energy loss to the substrate by inductive coupling. The ground plane (190) may be formed using one of various methods according to exemplary embodiments of the invention.

In one exemplary embodiment, the ground plane (190) may be doped regions of n-type dopants, which produce local areas of charge depletion. The ground plane (190) can be formed by performing a masked dopant implant process to implant n-type dopants in the bulk layer (110c) at desired concentration and depth.

In another embodiment, the ground plane (190) for the backside inductor may be fabricated by forming a pattern of high energy, high current oxygen implants on the backside of the wafer (110c) to create embedded islands of oxide under the backside surface of the wafer (110c). These embedded islands serve to break up the potential inductive currents in the substrate. Chains of implants can be used to create oxide columns which extend from the wafer surface to deep within the wafer. The pattern for these implants is similar to that shown for the insulating regions of the ground-plane in FIG. 2.

In another exemplary embodiment, the ground plane (190) can be fabricated by forming shallow trench isolation on the backside of the wafer. In particular, the ground plane (190) can be formed by etching trenches in the backside surface of the bulk silicon layer (110c), depositing an insulation material (e.g., oxide) to fill the trenches, and then polishing the insulation material down to the backside surface of the bulk layer (110c), to thereby form isolation islands having a pattern as shown for the insulating areas of the ground plane (190) in FIG. 2.

In the exemplary embodiments described above, the mask levels for the backside processing can be aligned to the frontside through-wafer contact level using infra-red alignment methods, which are capable of "seeing through" the bulk silicon layer (110c) and aligning to the metal of the contacts. Such alignment can be performed with respect to the contacts or alignment makes formed simultaneously with the contacts. If the ground plane (190) is constructed such that is provides distinct optical regions (e.g., STI-like isolation trenches), then subsequent levels can be aligned back to the level of the ground plane (190). However, if the ground plane (190) is a buried implant or formed by any other type of invisible/subsurface process, then the next level, which is the inductor trench, can be aligned to the frontside contact levels.

Upon completion of the ground-plane processing, a backside insulation layer (200) is formed over the backside surface of the silicon wafer (110c). The insulation layer (200) may be formed of an insulation/dielectric material such as silicon oxide, polyimide and other suitable materials. The insulation layer (200) can be formed by blanket depositing an insulating or dielectric material using spin-on, CVD or other known techniques. Preferably, the insulating layer (200) is formed with a material having a low dielectric constant as possible to optimize the inductor performance. The insulation layer (200) is formed with a thickness in a range from about 10 microns to about 100 microns, and thick layers are preferred for improving performance.

Figure 3G:
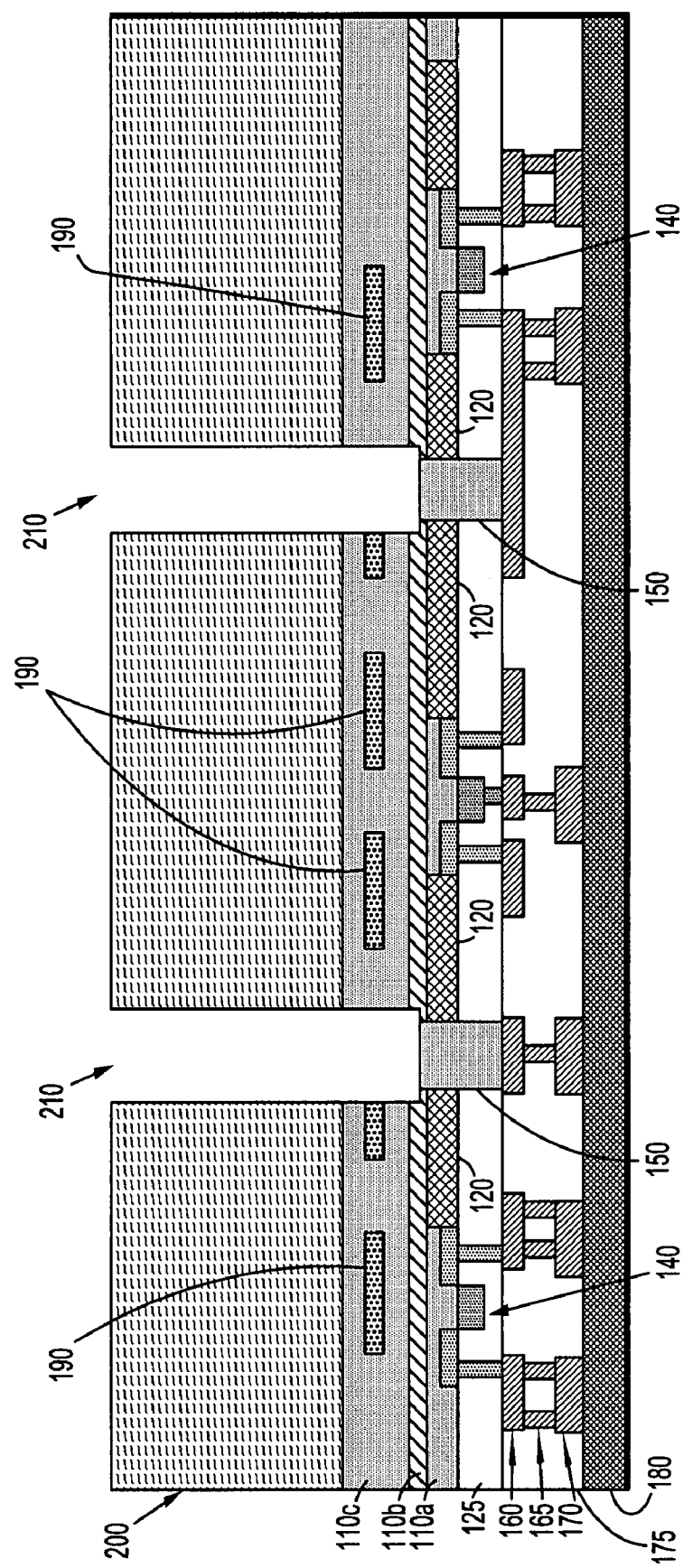

Referring now to FIG. 3G, backside contact via holes (210) are formed through the backside insulation layer (200) and bulk silicon (110c) to expose end portions of the frontside contacts (150) in the BOX layer (110b). The backside contact via holes (210) may be formed using known photolithographic methods, where a photoresist mask pattern is formed having openings that define the backside contact via holes (210) that are aligned with the through-wafer contacts (150) using infra-red techniques. In one exemplary embodiment of the invention, the backside contact via holes (210) are formed to define through-wafer backside contact plugs that are formed to electrically connect the inductor coil to the through-wafer frontside contacts (150).

Figure 3H:
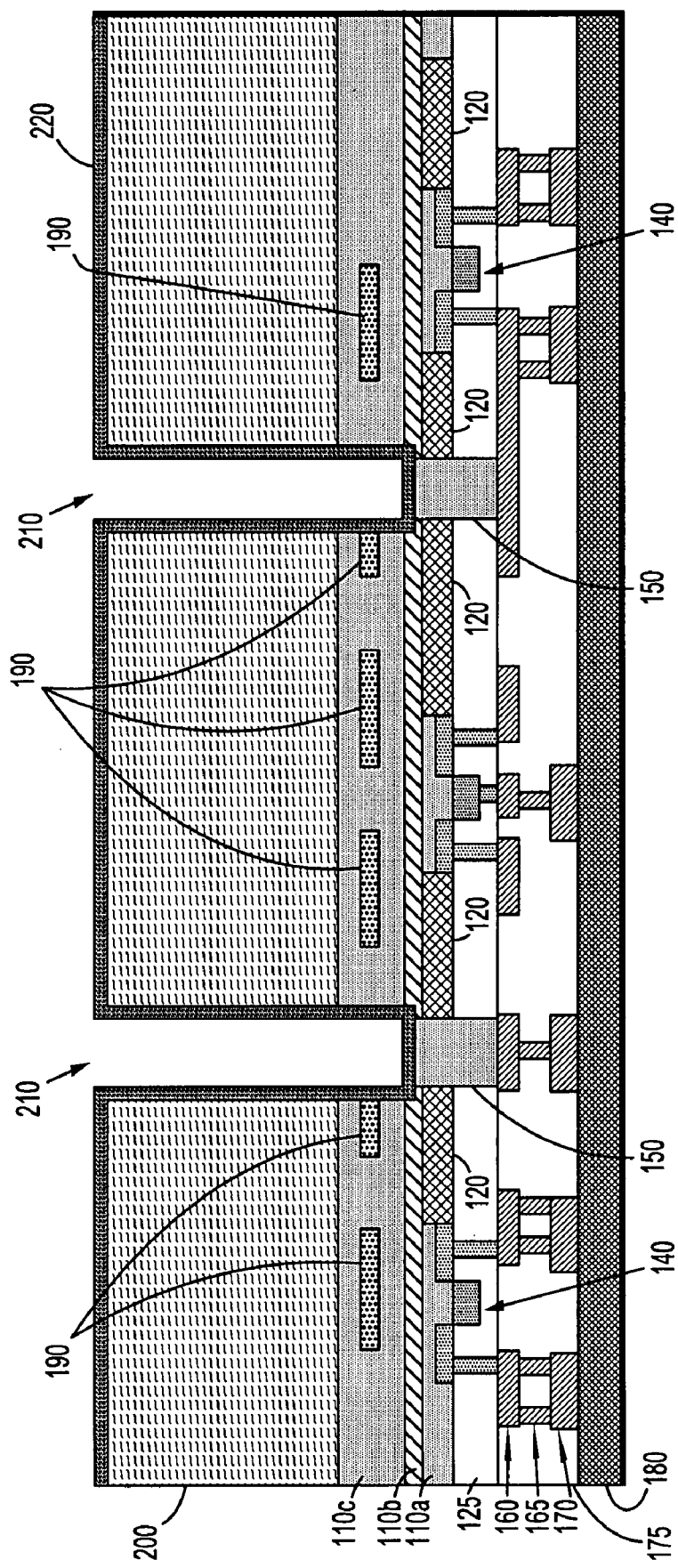

Referring to FIG. 3H, a conformal liner layer (220) is formed over the backside to line the exposed sidewall and bottom surfaces of the backside contact via holes (210). The liner layer (220) may be formed by depositing one or more layers of suitable liner materials. For instance, a first layer may be deposited providing a barrier layer which prevent migration of conductive material into the via. A second layer may be an adhesion layer formed on the barrier layer to that forms good adhesion to both the barrier metal and to a third metal (e.g., copper) that fills the via holes. For example, the liner layer (220) may be formed by depositing one or more conformal layers of TaN or TiN using PVD, CVD, etc. A single layer of TiN functions as both a barrier metal and adhesion layer. The liner layer (220) may be deposited with a thickness in a range from about 1000A to about 5 microns. The isolation film (220) serves to isolate the contacts from the substrate (200) to minimize substrate losses. The thickness of the isolation film layer (220) is inversely proportional to the substrate coupling capacitance, and thus directly impacts capacitive losses to the substrate.

Figure 3I:
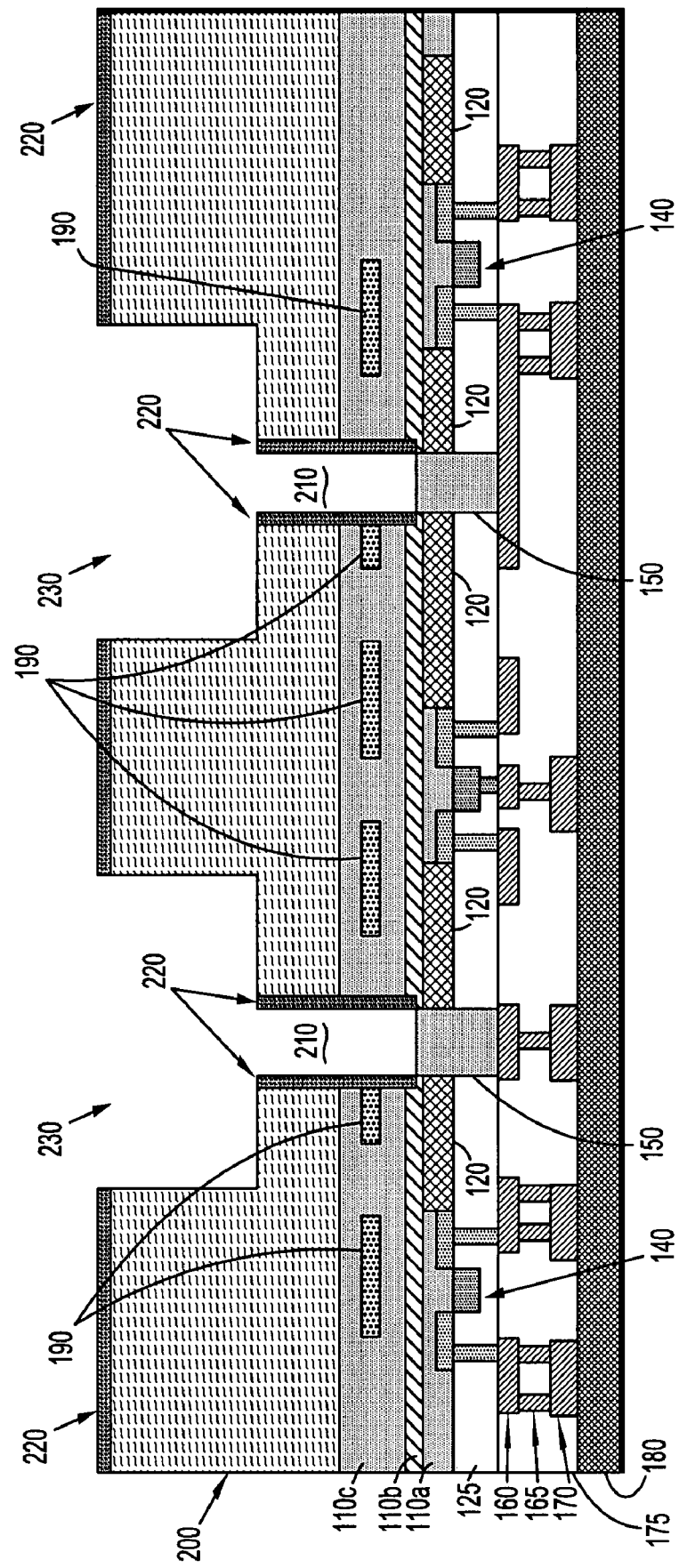

Following formation of liner layer (220), inductor trenches (230) are formed which define the inductor structure, resulting in the structure depicted in FIG. 3I. The trenches are formed using a photolithographic process that aligns to the backside contacts (150). The trenches (230) are formed by RIE etching the portion of the insulation layer (200) exposed through a photoresist mask. In one embodiment, the trench RIE terminates at the mid-plane of the backside insulator layer (200), although deeper trenches may be formed depending on the application to achieve inductor structures with reduced series resistance and improved performance. An anisotropic finish RIE may be performed at the end of the trench etch to remove the portion of the liner layer (220) at the bottom of the backside contact via holes (210), while leaving the liner (220) on the sidewalls of the backside contact via holes (210).

Figure 3J:
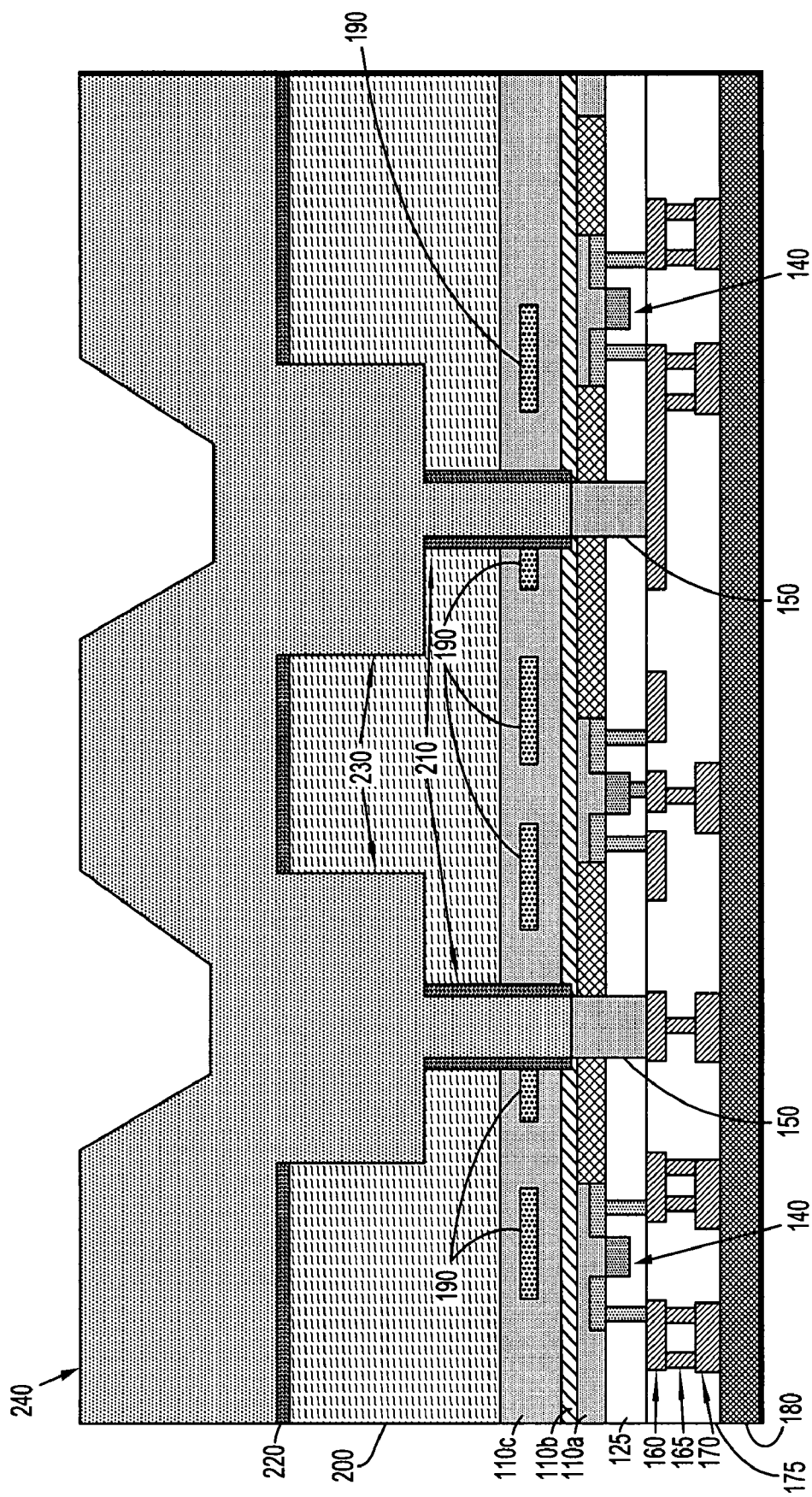
Figure 3K:
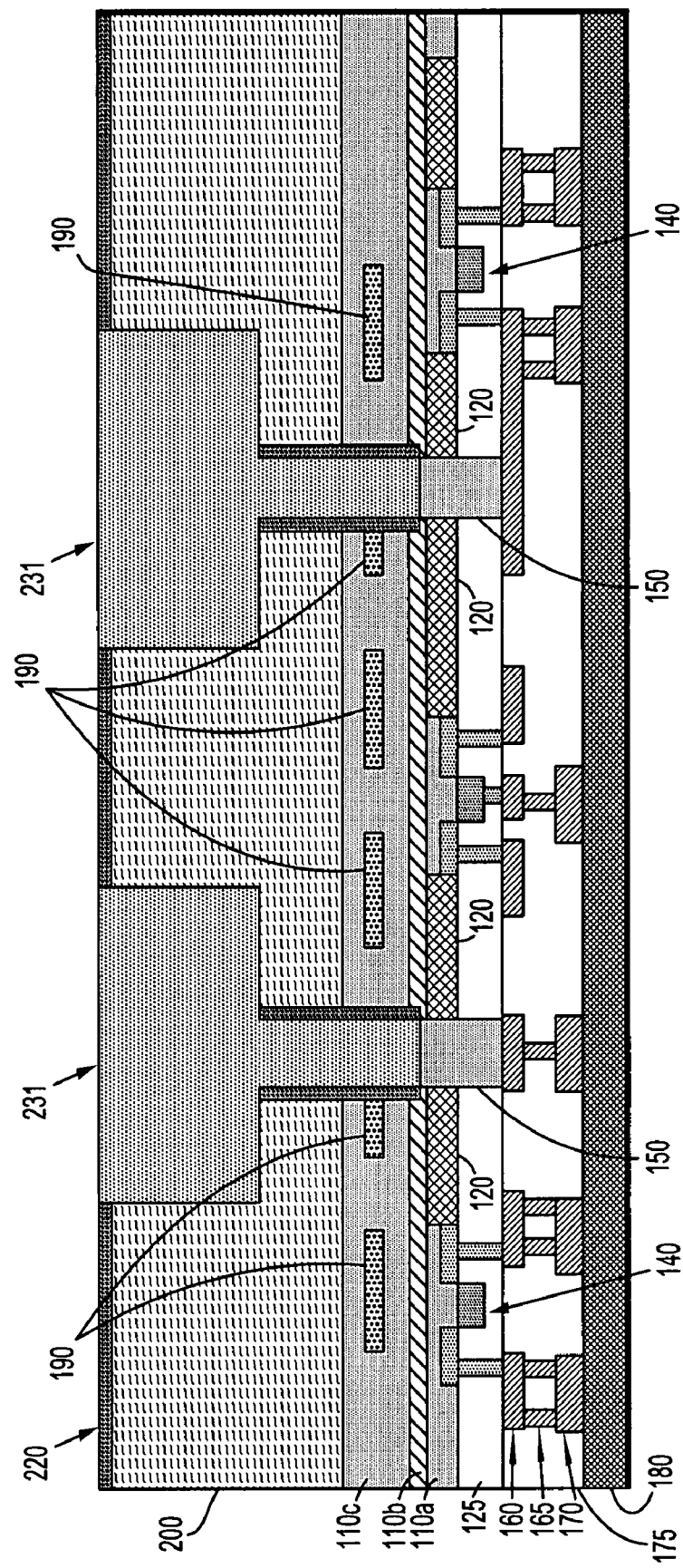
Figure 3L:
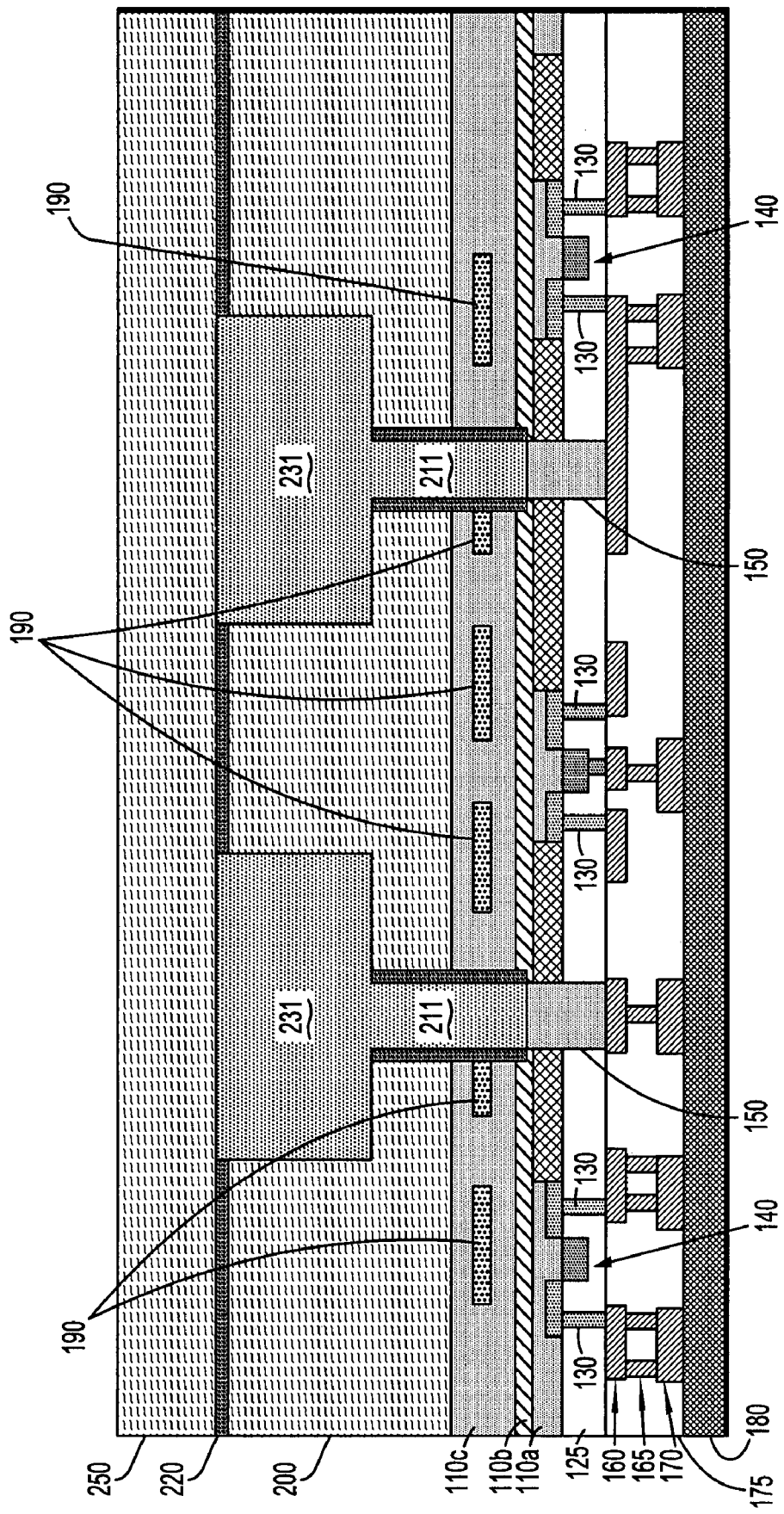

Referring to FIGS. 3J and 3K, a metallic material (240) is deposited over the backside of the wafer to fill the trenches (230) and backside contact via holes (210) with the metallic material (240) and form the through-wafer backside contact plugs (211) and the inductor coil structure (231) (e.g., a planar spiral inductor as depicted in FIG. 2). The metallic material (240) may be tungsten W, Al, Cu, or alloys thereof, etc, or other metallic material having relatively low resistivity so as to form a high-Q inductor with high performance. Prior to metal deposition, a blanket deposition step may be formed to form a thin conformal metallic seed layer over the exposed inner walls of the trenches (230) and backside contact via holes (210) to facilitate metal plating or adhesion, as is understood by those of ordinary skill in the art.

Referring to FIG. 3K, the excess metal (240) is polished back and the wafer backside is planarized using CMP, for example. The metal planarization process terminates at the backside dielectric (220) by using an endpoint method typical of metal polish processes. Then, referring to FIG. 3L, a thick non-conductive passivation layer (250) is formed over the backside to cover the inductor (231), resulting in the structure of FIG. 1 as discussed above (which is shown frontside down in FIG. 3L). Various materials such as silicon oxide, silicon nitride, polyimide, etc. may be used to form the passivation layer (250), which serve to provide electrical and mechanical protection to the backside features, and mechanical support to the chip module.

In the exemplary fabrication process discussed above, the inductor structure (231) and through-wafer backside contact plugs (211) are integrally formed using a standard via first dual damascene process, wherein the backside contact via holes (210) and trenches (230) are sequentially etched in a layer of dielectric material (200) in alignment with the frontside through wafer contact plugs (150) and wherein the backside contact via holes (210) and trenches (230) are filled with a metallic material in a single metal deposition process (e.g., copper electroplating) to integrally form the through-wafer backside contact plugs (211) (and possible dummy contact plugs) and inductor coil (231). However, it is to be understood that other standard processes such as single damascene or subtractive etch techniques may be used to form the through-wafer backside contact plugs (211) and inductor coil (231).

In the exemplary embodiment of FIG. 1, for example, the inductor coil (231) is embedded in the layer of insulating material (200) which serves as mechanical support for the inductor coil (231). The performance of a backside inductor can be enhanced by reducing the amount of dielectric material surrounding the inductor coil metal and/or between adjacent layers of a backside inductor structure. Indeed, in the exemplary embodiment of FIG. 1, optimal performance can be achieved where the insulating material (200) is fully removed leaving behind a vacuum or an air gap. However, if the insulation material (200) is removed, the inductor coil (231) may be left unsupported and thus susceptible to damage by collapsing or delamination during further chip processing or mechanical handling. In this regard, exemplary embodiments of the invention include methods for fabricating air-gap backside inductor structures where the backside insulation layer is removed to form an air gap for enhanced inductor performance, while one or more dummy or redundant and non-electrical backside contact plugs are formed to serve as support columns for the inductor coil metal layer in the absence of the backside insulating material.

Figure 4:
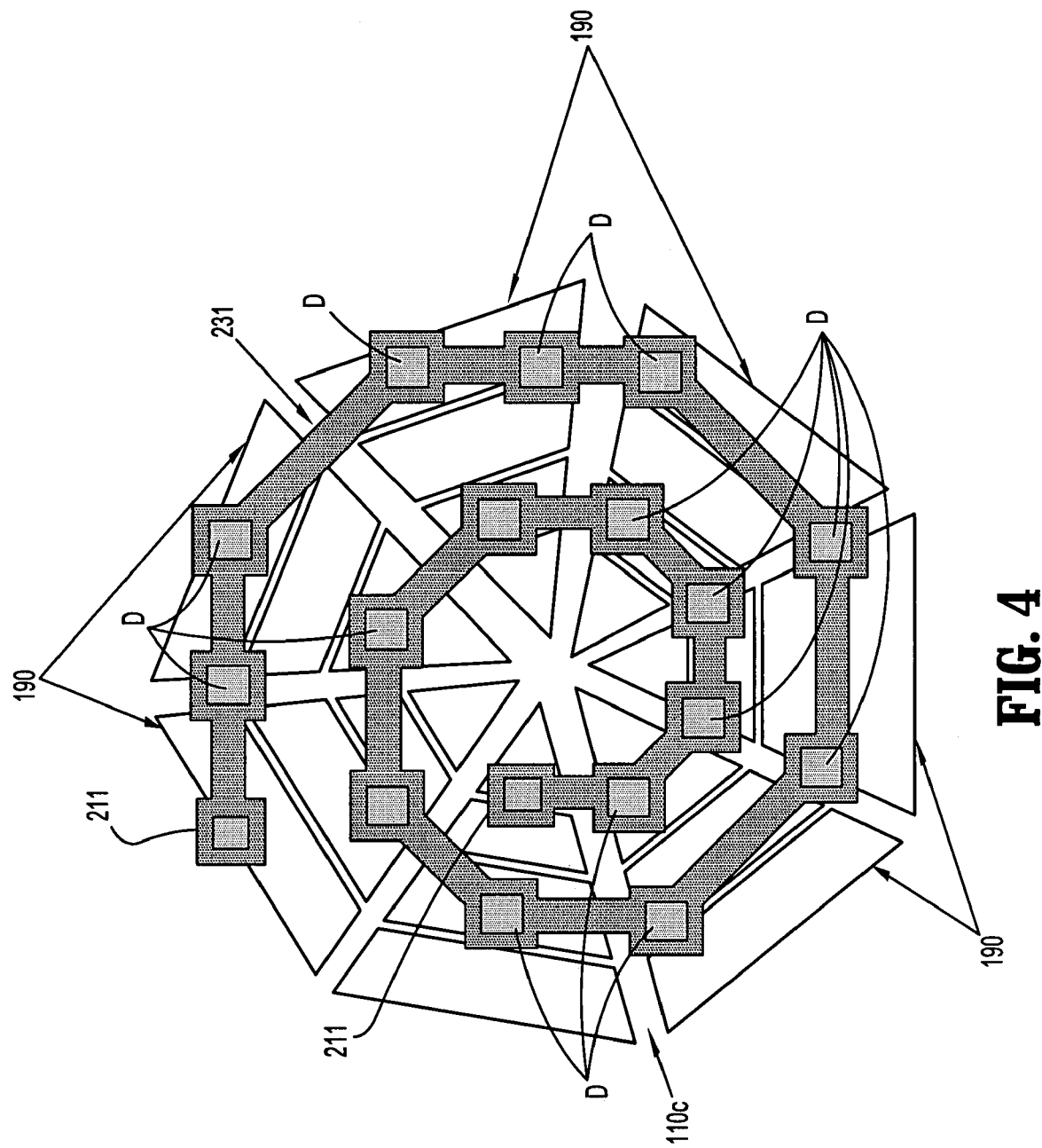
FIG. 4 is a schematic plan view of a backside integrated inductor structure with patterned ground plane according to another exemplary embodiment of the invention.

For example, FIG. 4 is a schematic plan view illustration of an exemplary air-gap backside integrated inductor structure according to an exemplary embodiment of the invention. In particular, FIG. 4 schematically illustrates an exemplary embodiment similar to that described above with reference to FIG. 2, where the inductor coil (231) is a planar spiral inductor and the ground plane (190) has a segmented radial shielding pattern, and where the end portions of the spiral inductor coil (231) are connected to, and aligned with, through-wafer backside contact plugs (211) that extend through the ground plane (190) and contact the through-wafer frontside contact plugs (150) as described above.

The exemplary embodiment of FIG. 4 differs from that of FIG. 2 in that, e.g., an air/vacuum cavity or gap exists between the inductor coil (231) and the bulk silicon layer (110c) in which the ground shield (190) is formed. Moreover, a plurality of backside dummy plugs (D) are formed in alignment at various points along the inductor coil (231) to serve as support columns extending from the bulk layer (110c) in the air cavity underneath the inductor coil (231). The exemplary inductor structure of FIG. 4 can be fabricated using methods discussed hereafter with reference to FIGS. 5A~5G.

Figure 5A:
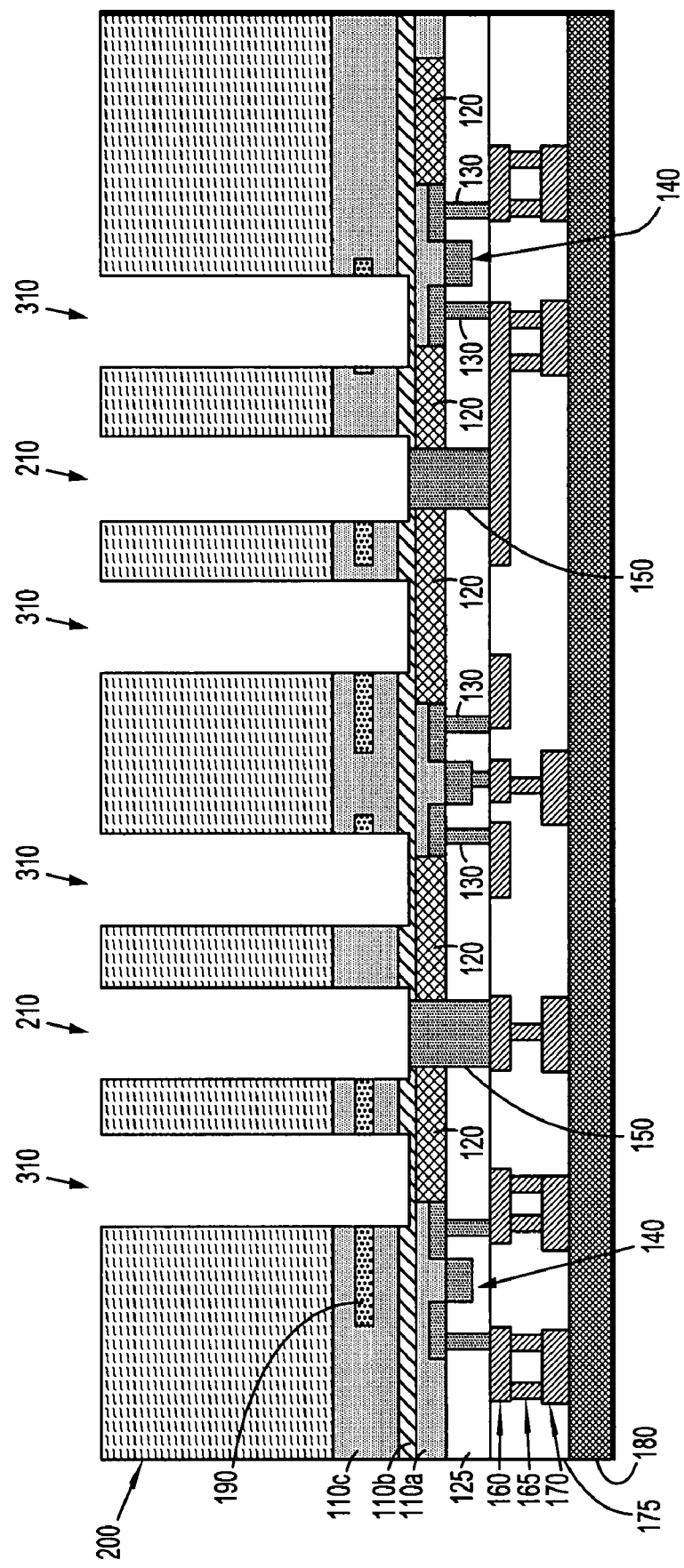
FIGS. 5A~5G schematically illustrate a method for fabricating a semiconductor IC chip with backside integrated inductors according to an exemplary embodiment of the invention.

FIGS. 5A~5G schematically illustrate a method for fabricating microelectronic chip with a backside air-gap inductor structure according to another exemplary embodiment of the invention. For purposes of illustration, it is assumed that FIG. 5A illustrates processing steps starting from the exemplary structure depicted in FIG. 3F. In other words, in one exemplary embodiment of the invention, a method for fabricating backside air gap inductor structures implements the processing steps discussed above with reference to FIGS. 3A~3F.

FIG. 5A illustrates a structure that results from etching backside contact via holes (210) and (310) formed through the backside insulation layer (200) and bulk silicon (110c) (in FIG. 3F) using known photolithography methods. As in the exemplary embodiment discussed above, the backside contact via holes (210) are formed in alignment with the through-wafer contacts (150) to expose end portions of the frontside contacts (150) in the BOX layer (110b). The backside contact via holes (210) are formed to define through-wafer backside contact plugs that are formed to electrically connect the inductor coil to the through-wafer frontside contacts (150). The contact holes (310) are formed in regions aligned to the inductor coil but not aligned to through-wafer frontside contacts (150). The contact holes (310) are formed to define support columns that support the coil metallization as discussed in further detail below.

Figure 5B:
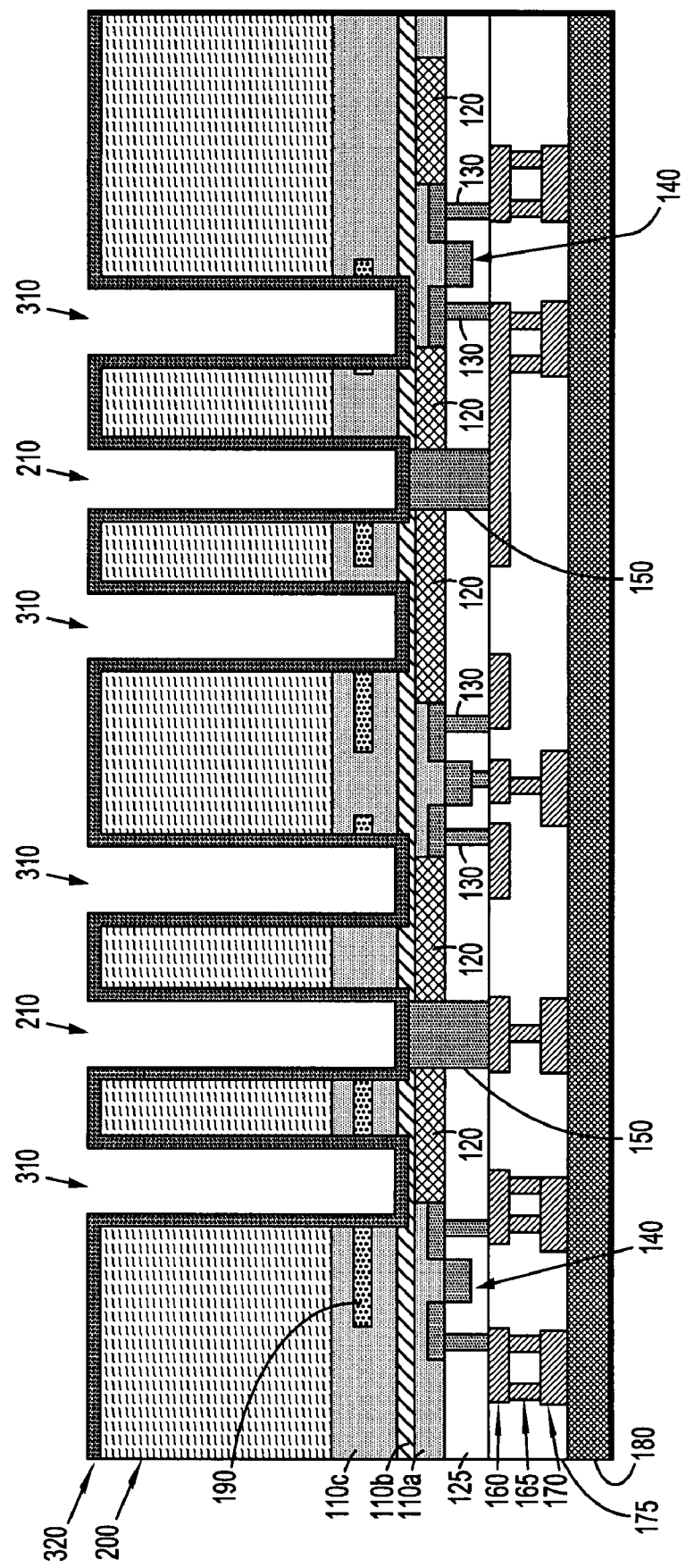
Figure 5C:
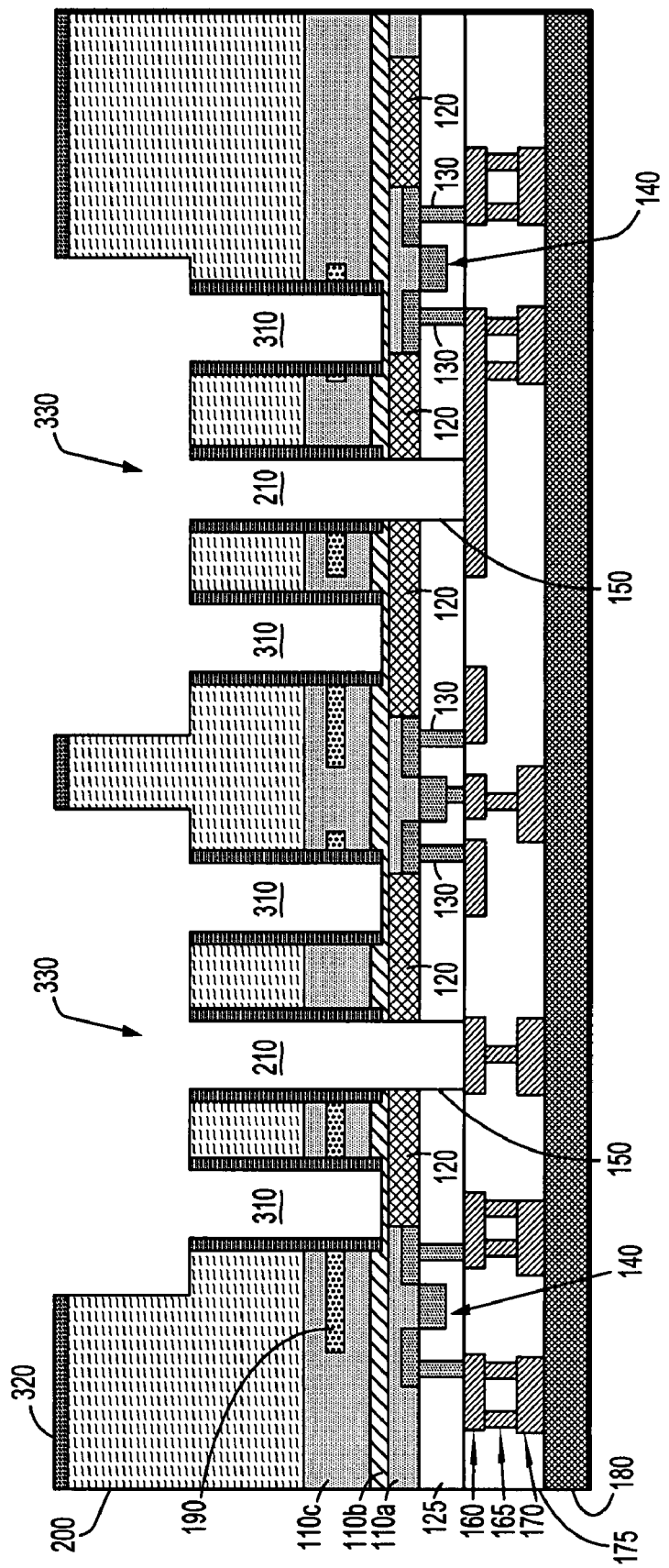

Referring to FIG. 5B, a conformal insulating liner layer (320) is formed over the backside to line the exposed sidewalls and bottom surfaces of the backside contact via holes (210) and (310). The insulating liner (320) serves to isolate the dummy and electrical contacts from the substrate. The liner (320) can be formed using materials and methods discussed above with reference to FIG. 3H, for example. Following formation of the insulating liner layer (320), inductor trenches (330) are formed which define the inductor structure, resulting in the structure depicted in FIG. 5C. The trenches (330) may be formed using a photolithographic process that aligns to the backside contacts (150). The trenches (330) can be formed by RIE etching the portion of the insulation layer (200) exposed through a photoresist mask. As discussed above, the depth of the trench defining the thickness of the inductor coil can vary depending on the application and desired performance. An anisotropic finish RIE may be performed at the end of the trench etch to remove the portion of the liner layer (320) at the bottom of the backside contact via holes (210) and (310), while leaving the liner (320) on the sidewalls of backside contact via holes (210) and (310).

Figure 5D:
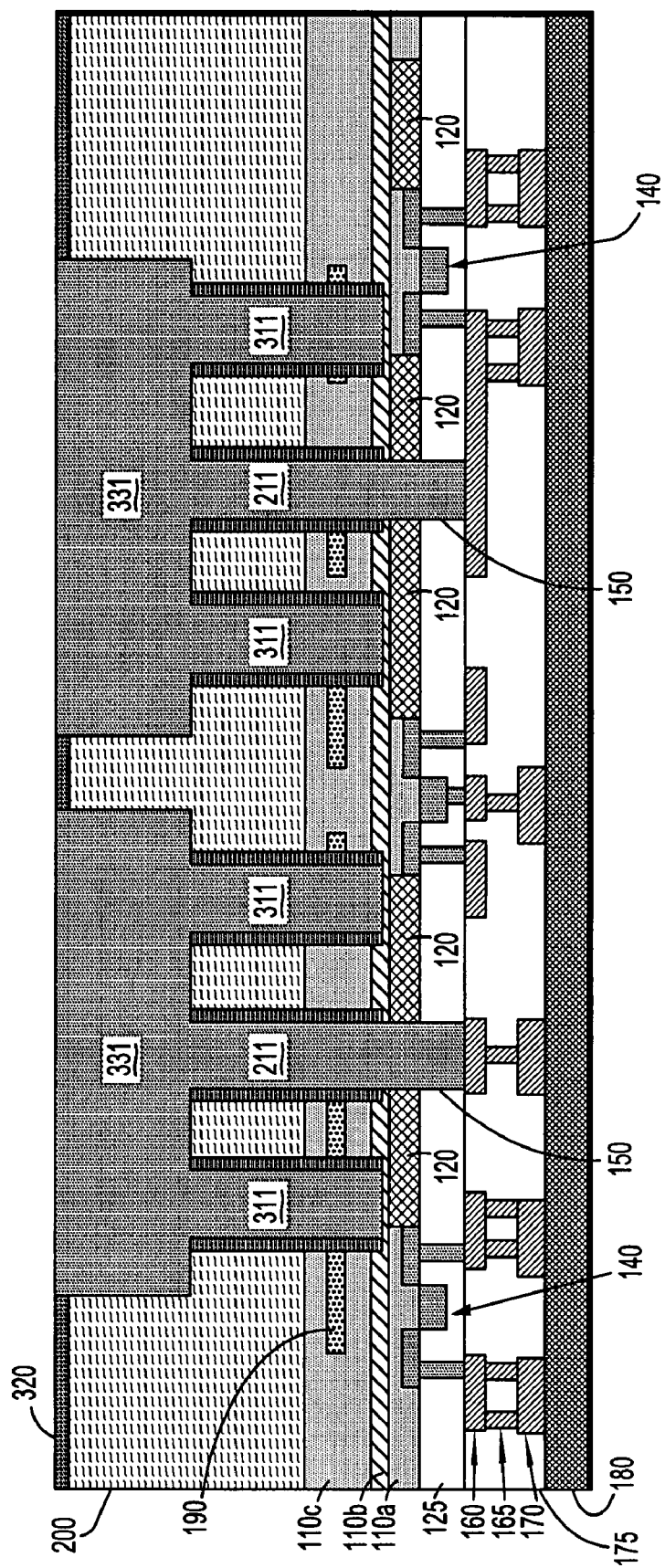

Next, a metallic material is deposited over the backside of the wafer to fill the trenches (330) and backside contact via holes (210) and (310) with the metallic material, followed by polishing/planarizing (e.g., CMP) of the wafer backside to remove the excess metal down to the backside insulating layer (320) using an endpoint method typical of metal polish processes. The resulting structure is depicted in FIG. 5D, which has through-wafer backside contact plugs (211), dummy contact plugs (311) and an inductor coil structure (331). The metallic material may be tungsten W, Al, Cu, or alloys thereof, etc., or other metallic material having relatively low resistivity so as to form a high-Q inductor with high performance. Prior to metal deposition, a blanket deposition step may be formed to form a thin conformal metallic seed layer over the exposed inner walls of the trenches (330) and the backside contact via holes (210) and (310) to facilitate metal plating or adhesion, as is understood by those of ordinary skill in the art.

Figure 5E:
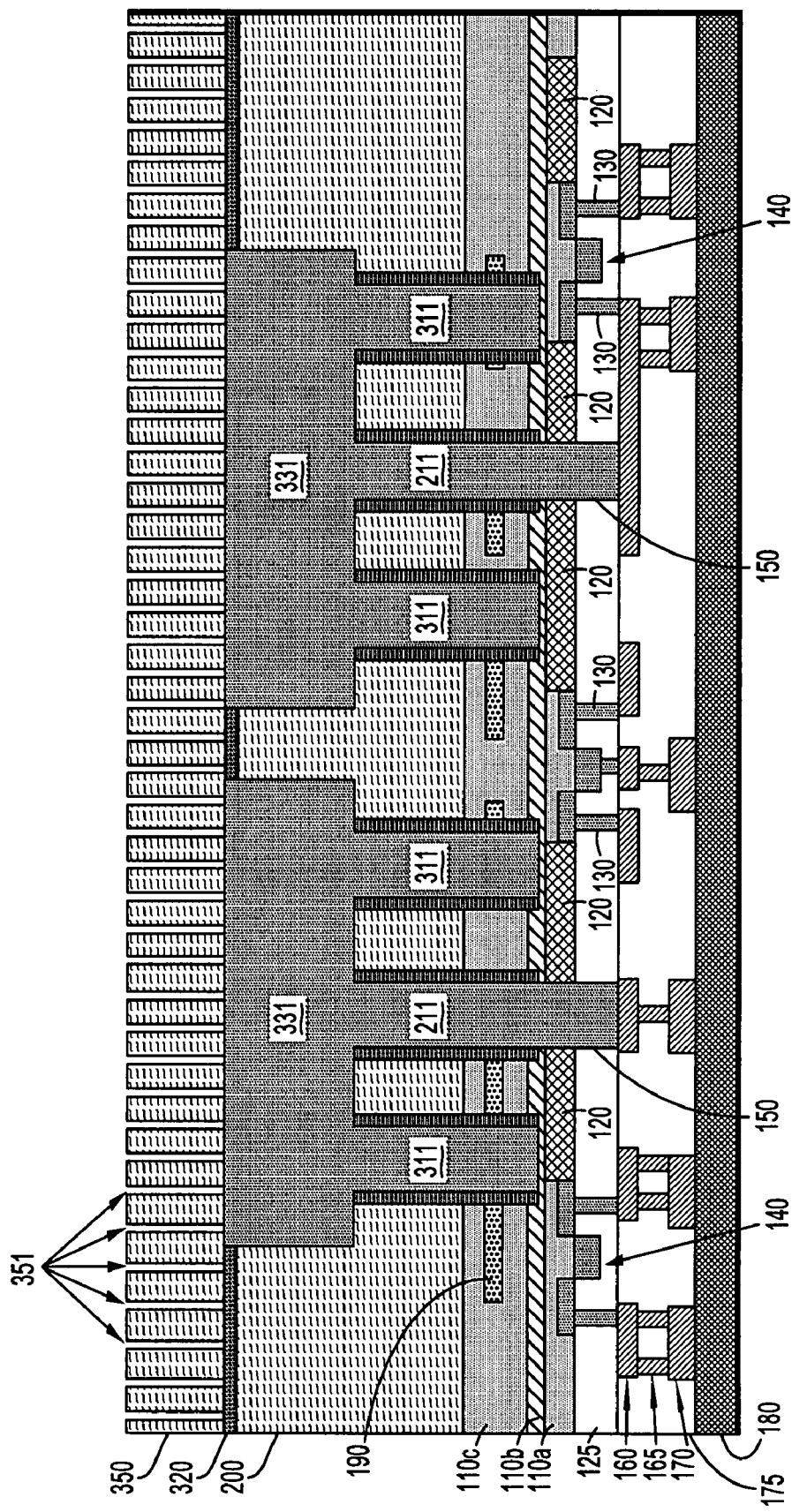

Referring to FIG. 5E, a thick non-conductive porous capping layer (350) having a plurality of through pores (351) is formed over the backside resulting in the structure of FIG. 5E. The through pores (351) may either be an inherent property of the material (350) or may be created by photolithographic patterning. A hard mask film may be deposited before the porous material layer (350) to be used for pattern transfer.

Figure 5F:
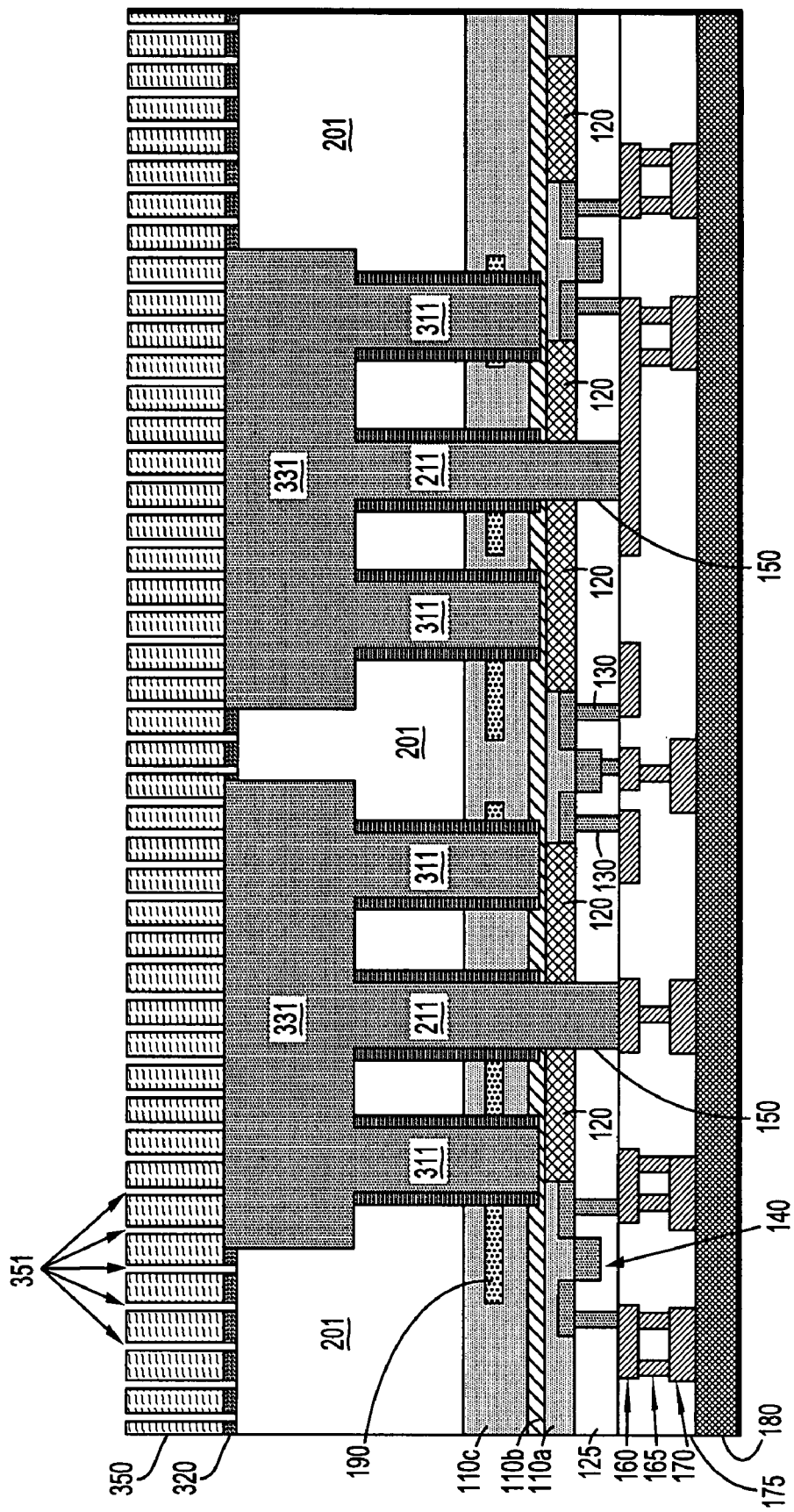

Next, as depicted in FIG. 5F, the backside insulating material (200) is removed by selective etching of the material through the pores (351) in the porous capping layer (350) and holes formed in the liner layer (320). This process may be performed by transferring the pattern of the pores (351) to the liner layer (320) (or into a hard mask layer that is deposited before deposition of the porous film (350)) and then flowing a selective wet etchant or RIE species through the pores (351). The etchant that is used does not attack the metal (331), but dissolves the insulating material (200) between the inductor wires (331) and the through-wafer backside contact plugs (211) and the dummy contact plugs (311), resulting in an open cavity region (201). Then, referring to FIG. 5G, the entire backside of the wafer is capped by a passivation layer (360) to protect the wafer backside.

In the exemplary embodiment discussed above, the dummy contacts (311) do not serve as electrical contacts, but are used as support and anchoring structures for the air gap inductor structure. The backside contact via holes (210) and (310) and trenches (330) are filled at the same time using one metallization process such that the through-wafer backside contact plugs (211), inductor coil (331) and the dummy contact plugs (311) are integrally formed and consist of the same continuous layer of metal such that one end of each dummy contact (311) is integrally connected to the inductor coil (331). Moreover, one end of each dummy contact (311) is embedded in the backside of the substrate. Since one end of the dummy contacts (311) is embedded in the substrate wafer and the other end is contiguous with the inductor wiring (331), the dummy contacts (311) server as anchors and support columns for the inductor coils (331), reducing the risk of structural delamination of the inductor coil (331). Moreover, the rigidity of the metallic dummy contacts (311) protects against structural collapse of the inductor coils (331).

Figure 5G:
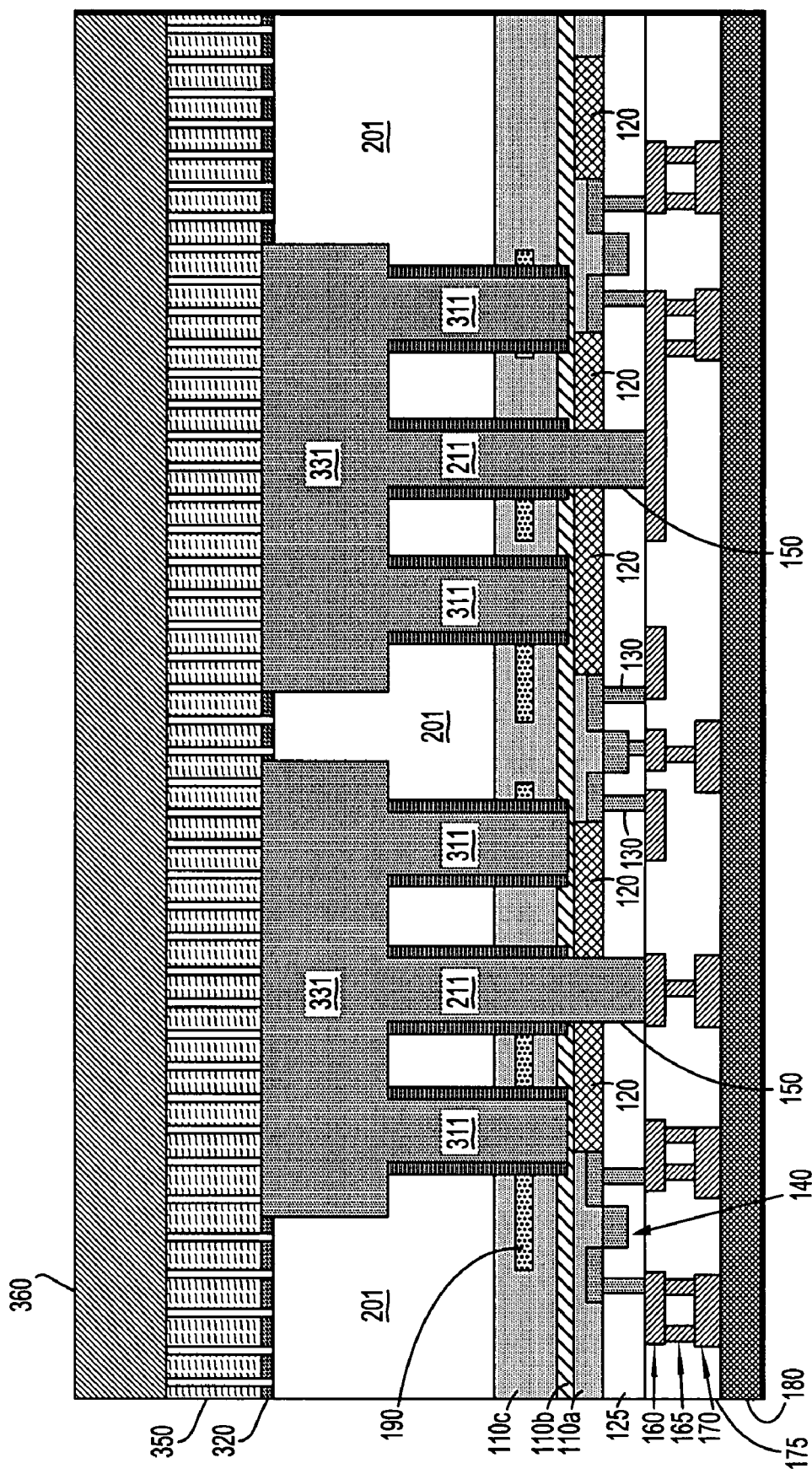

The placement of the dummy contacts and the amount of dummy contacts used for a given design will vary depending on the inductor coil structure. For instance, the exemplary embodiment of FIG. 4 shows numerous dummy contacts (D) placed along the length of the coil (231) where one dummy contact (D) is sufficient at each point to support coil width. If the inductor coils are relatively wide, multiple dummy contacts can be placed across the width of the coil for added support, such as depicted in the exemplary embodiment of FIG. 5G, for example. In particular, FIG. 5G illustrates one exemplary embodiment where the through-wafer backside contact plug (211) is aligned to the center point along the width of the coil (331), where dummy contacts (311) are disposed on opposite sides of the through-wafer backside contact plug (211) along the width to support the ends of the inductor coil (331).

It is to be appreciated that there are various advantages associated with exemplary methods of the invention for fabricating semiconductor devices with backside inductor structures according to the invention. For instance, high-density integration can be achieved by forming inductors (which typically have large footprints) on the chip backside and thus, saving chip frontside area for more dense packaging of circuit components and interconnections. Moreover, backside inductors can be disposed in relatively close relation to the frontside integrated circuit such that the length of interconnects are minimized and thus minimizing the series resistance of the through-wafer interconnect structures.

Moreover, by forming backside inductors, the backside processing for fabricating the inductors is decoupled from the frontside processing for fabricating the integrated circuit on the chip active surface. This allows the fabrication of the inductor components with the desired conductive materials and embedding dielectric and structural framework (pitch, metal thickness) to be optimized for high quality performance independent from other chip fabrication steps. For instance, the backside metallization which comprise the inductor coils and contacts can be selected with a high conductive metal such as copper or aluminum and embedded in a thick insulating/dielectric layer having desirable properties to achieve a desired performance. The insulating/dielectric layer can be chosen to be a low-K material that can easily be deposited on the backside to large thicknesses to achieve low parasitic environment for the inductor circuit.

Overall, the relatively low series resistance afforded by physical proximity of the backside inductor to the frontside integrated circuit with space savings provided by moving the inductor off the active area of the chip onto the backside, allows for high density packaging. Moreover, performance enhancement is provided though optimizing inductor layer pitches and materials, while cost and complexity are reduced by using simple, semiconductor-fabrication-compatible processing steps that allow for precision fabrication of high-Q inductors with high self resonance frequencies. For example, backside inductors can be fabricated using exemplary methods as described herein having inductance values of around 1-30 nH with Q-values around 80 or higher at frequencies of 2 GHz or higher. In addition, a ground plane can be readily formed as part of the backside processing for maximizing inductor performance and achieving inductor structures having high self-resonance frequency with low cross talk to frontside integrated circuits.

It is to be appreciated that the exemplary fabrication techniques discussed herein can be employed for constructing integrated backside antenna structures for integrated radio communication applications. Indeed, the exemplary methods can be used to construct various types of backside planar antenna structures depending on the intended application and/or frequency of operation. For example, planar antenna structures such as dipole antennas, folded dipole antennas, ring antennas, rectangular loop antennas, patch antennas, coplanar patch antennas, quarter-wave monopole antennas (such as PIFA (planar inverted F antenna), etc., can be fabricated backside and connected to frontside RF circuitry (e.g., LNAs, power amplifier, etc.) using through-wafer interconnects that are formed as part of the antenna feed lines and/or impedance matching networks, for example. Moreover, the inductor ground shields discussed above can be antenna ground planes that are fabricated as part of the antenna designs for purposes of providing reflecting ground planes (maintaining radiation pattern in hemisphere above backside of chip) and/or providing the necessary ground plane structures for quarter-wave antenna radiators.

In other exemplary embodiments of the invention, the exemplary inductor fabrication techniques discussed herein can be combined with backside capacitor fabrication techniques to fabricate high-Q backside RC circuits (e.g., filters), such as those backside capacitor fabrication techniques disclosed in U.S. patent application Ser. No. 11/443,394, filed on May 30, 2006, entitled SEMICONDUCTOR INTEGRATED CIRCUIT DEVICES HAVING HIGH-Q WAFER BACKSIDE CAPACITORS, which is fully incorporated herein by reference.

Although exemplary embodiments have been described herein with reference to the accompanying drawings for purposes of illustration, it is to be understood that the present invention is not limited to those precise embodiments, and that various other changes and modifications may be affected herein by one skilled in the art without departing from the scope of the invention.

We claim:

1. A method of forming a semiconductor device, comprising:
   forming an integrated circuit on a frontside of a semiconductor substrate;
   forming an integrated inductor within a backside insulating layer on a backside of the semiconductor substrate;
   forming an interconnection structure through a buried insulating layer interposed between the frontside and backside of the semiconductor substrate, which connects the integrated inductor to the integrated circuit;
   forming a ground plane within the backside insulating layer on the backside of the semiconductor substrate,
   wherein forming the integrated inductor structure comprises:
      filling a first plurality of via holes etched in a the backside insulating layer to form backside contact plugs;
      filling a trench etched in the backside insulating layer to form an inductor coil, wherein the backside contact plugs form part of the interconnection structure for connecting the inductor coil to the frontside integrated circuit;
      filling a second plurality of via holes in the backside insulating layer to form backside dummy contact plugs to support the integrated inductor, wherein the backside dummy contact plugs each have one end embedded in the backside of the semiconductor substrate and do not form part of the interconnection structure for connecting the inductor coil to the frontside integrated circuit; and
      forming an air gap surrounding the integrated inductor by removing insulation material from the backside insulating layer.

2. The method of claim 1, wherein the semiconductor substrate is SOI (silicon on insulator) structure.

3. The method of claim 1, wherein forming the interconnection structure comprises:
   forming a through-wafer frontside contact plug having a first end in the buried insulating layer of the semiconductor substrate and a second end contacting a frontside metal level; and
   forming a through-wafer backside contact plug having a first end in the buried insulating layer of the semiconductor substrate and a second end contacting an inductor coil structure such that the first ends of the through-wafer frontside and backside contact plugs are electrically contacted to each other.

4. The method of claim 1, wherein forming the integrated inductor on the backside of the semiconductor comprises forming one or more layers of metal embedded in the backside insulating layer.

5. The method of claim 1, wherein forming the ground plane comprises forming insulating islands formed by oxygen ion implantation on in the backside insulation layer of the semiconductor substrate.

6. The method of claim 1, wherein forming the ground plane comprises forming a shallow trench isolation pattern formed on in the backside insulation layer of the semiconductor substrate.

7. The method of claim 1, wherein forming the ground plane comprises forming doped regions of silicon on in the backside insulation layer of the semiconductor substrate.

8. A method of forming a semiconductor device, comprising:
   forming an integrated circuit on a frontside of a semiconductor substrate;
   forming an integrated inductor within a backside insulating layer on a backside of the semiconductor substrate;
   forming an interconnection structure through a buried insulating layer interposed between the frontside and backside of the semiconductor substrate, which connects the integrated inductor to the integrated circuit; and
   forming a ground plane disposed between the backside integrated inductor and the frontside integrated circuit, wherein forming the ground plane comprises forming insulating islands formed by oxygen ion implantation on the backside of the semiconductor substrate.

9. The method of claim 8, wherein the semiconductor substrate is SOI (silicon on insulator) structure.

10. The method of claim 8, wherein forming the interconnection structure comprises:
    forming a through-wafer frontside contact plug having a first end in the buried insulating layer of the semiconductor substrate and a second end contacting a frontside metal level; and
    forming a through-wafer backside contact plug having a first end in the buried insulating layer of the semiconductor substrate and a second end contacting an inductor coil structure such that the first ends of the through-wafer frontside and backside contact plugs are electrically contacted to each other.

11. The method of claim 8, wherein forming the integrated inductor on the backside of the semiconductor comprises forming one or more layers of metal embedded in the backside insulating layer.

* * * * *